(12) United States Patent
Jang et al.

(10) Patent No.: US 12,493,216 B2
(45) Date of Patent: *Dec. 9, 2025

(54) DISPLAY APPARATUS INCLUDING ANTISTATIC PORTION

(71) Applicant: SAMSUNG ELECTRONICS CO., LTD., Suwon-si (KR)

(72) Inventors: Hyukjun Jang, Suwon-si (KR); Kyehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/882,301

(22) Filed: Sep. 11, 2024

(65) Prior Publication Data

US 2025/0004330 A1    Jan. 2, 2025

Related U.S. Application Data

(63) Continuation of application No. 18/200,253, filed on May 22, 2023, now Pat. No. 12,111,542, which is a
(Continued)

(30) Foreign Application Priority Data

Oct. 23, 2020    (KR) .................. 10-2020-0138630

(51) Int. Cl.
*G02F 1/1335* (2006.01)
*G02F 1/13357* (2006.01)
(Continued)

(52) U.S. Cl.
CPC .. *G02F 1/133612* (2021.01); *G02F 1/133605* (2013.01); *H01L 25/0753* (2013.01);
(Continued)

(58) Field of Classification Search
CPC ......... G02F 1/133612; G02F 1/133605; H01L 25/0753; H05K 1/0259
See application file for complete search history.

(56) References Cited

U.S. PATENT DOCUMENTS 9,466,774 B2    10/2016    Kim et al.
11,132,096 B2    9/2021    Lee et al.
(Continued)

FOREIGN PATENT DOCUMENTS

CN    106647018 A    5/2017
JP    2008-47569 A    2/2008
(Continued)

OTHER PUBLICATIONS

Communication issued Jul. 30, 2024 by the European Patent Office in European Patent Application No. 21882950.5.
(Continued)

*Primary Examiner* — Tracie Y Green
(74) *Attorney, Agent, or Firm* — Sughrue Mion, PLLC

(57) ABSTRACT

Provided is a display apparatus including: a liquid crystal panel; a substrate; a light source module disposed on the substrate. The light source module includes a light emitting diode disposed on the substrate, a feed pad provided on the substrate, an antistatic pad provided on the substrate; and an insulating dome provided on the substrate and covering the light emitting diode. The antistatic pad is divided into two parts by an outline of the insulating dome.

20 Claims, 22 Drawing Sheets

Related U.S. Application Data continuation of application No. 17/749,782, filed on May 20, 2022, now Pat. No. 11,703,718, which is a continuation of application No. 17/353,427, filed on Jun. 21, 2021, now Pat. No. 11,385,500, which is a continuation of application No. PCT/KR2021/002823, filed on Mar. 8, 2021.

(51) Int. Cl.
   *H01L 25/075* (2006.01)
   *H01L 33/54* (2010.01)
   *H05K 1/02* (2006.01)
   *H05K 1/18* (2006.01)
   *H10H 20/853* (2025.01)

(52) U.S. Cl.
   CPC ..... *H05K 1/0259* (2013.01); *G02F 1/133603* (2013.01); *H05K 1/0274* (2013.01); *H05K 1/181* (2013.01); *H05K 2201/10106* (2013.01); *H10H 20/853* (2025.01)

(56) References Cited

U.S. PATENT DOCUMENTS

| | | | |
|---|---|---|---|
| 11,385,500 B2 | 7/2022 | Jang | |
| 11,703,718 B2 * | 7/2023 | Jang | H10H 20/855 349/62 |
| 2006/0097245 A1 | 5/2006 | Aanegola et al. | |
| 2007/0114640 A1 | 5/2007 | Kosowsky | |
| 2009/0027882 A1 | 1/2009 | Kim et al. | |
| 2011/0001422 A1 | 1/2011 | Aanegola et al. | |
| 2011/0051411 A1 | 3/2011 | Kim et al. | |
| 2011/0211289 A1 | 9/2011 | Kosowsky | |
| 2011/0279750 A1 | 11/2011 | Jeong et al. | |
| 2012/0057358 A1 | 3/2012 | Wu et al. | |
| 2015/0326767 A1 | 11/2015 | Kim | |
| 2016/0099394 A1 | 4/2016 | Kim et al. | |
| 2016/0252218 A1 | 9/2016 | Fujikawa et al. | |
| 2017/0123271 A1 | 5/2017 | Kim et al. | |
| 2020/0279838 A1 | 9/2020 | Chen et al. | |
| 2020/0348457 A1 | 11/2020 | Uto et al. | |
| 2021/0261755 A1 | 8/2021 | Kim | |
| 2022/0208742 A1 | 6/2022 | Kim | |

FOREIGN PATENT DOCUMENTS

| | | |
|---|---|---|
| JP | 2012-9794 A | 1/2012 |
| KR | 10-0788931 B1 | 12/2007 |
| KR | 10-2008-0009488 A | 1/2008 |
| KR | 101084201 B1 | 11/2011 |
| KR | 10-1109688 B1 | 6/2012 |
| KR | 10-2012-0092843 A | 8/2012 |
| KR | 10-2013-0055203 A | 5/2013 |
| KR | 10-2016-0040373 A | 4/2016 |
| KR | 10-2017-0050993 A | 5/2017 |
| KR | 101796584 B1 | 11/2017 |
| KR | 102059126 B1 | 12/2019 |

OTHER PUBLICATIONS

Communication dated Jul. 12, 2021, issued by the International Searching Authority in counterpart International Application No. PCT/KR2021/002823 (PCT/ISA/210).

Communication issued Oct. 19, 2023 by the European Patent Office in European Application No. 21882950.5.

KR10-2017-0050993 A machine translation May 2017.pdf (Year: 2017).

Kim et al. KR20130055203A, machine translation May 2013 (Year: 2013).

European Extended Search Report issued Jan. 24, 2025 by the European Patent Office for EP Patent Application No. 24207730.3.

Office Action issued Jan. 22, 2025 by the Korean Patent Office for KR Patent Application No. 10-2020-0138630.

Communication dated Sep. 23, 2025, issued by the China National Intellectual Property Administration in Chinese Application No. 202180050547.0.

* cited by examiner (a)

(b)

DISPLAY APPARATUS INCLUDING ANTISTATIC PORTION

CROSS-REFERENCE TO RELATED APPLICATIONS

This application is a continuation application of U.S. application Ser. No. 18/200,253 filed May 22, 2023, which is a continuation application of U.S. application Ser. No. 17/749,782, filed on May 20, 2022, now U.S. Pat. No. 11,703,718, issued on Jul. 18, 2023 which is a continuation application of U.S. application Ser. No. 17/353,427 filed on Jun. 21, 2021, now U.S. Pat. No. 11,385,500, issued on Jul. 12, 2022, which is a bypass continuation application of International Application No. PCT/KR2021/002823 filed on Mar. 8, 2021, which claims priority from Korean Patent Application No. 10-2020-0138630, filed on Oct. 23, 2020 in the Korean Intellectual Property Office, the disclosures of which are incorporated herein by reference in their entirety.

BACKGROUND

1. Field

The disclosure relates to a display apparatus and, more particularly, to a display apparatus capable of preventing or suppressing a light source from being damaged by static electricity, and a light source module thereof.

2. Description of Related Art

In general, a display apparatus is a kind of an output apparatus for converting obtained or stored electrical information into visual information and displaying the visual information for users. The display apparatus is used in various fields, such as homes, businesses, etc.

Display apparatuses include a monitor connected to a personal computer, a server computer, etc., a portable terminal (for example, a portable computer, a navigation terminal, a general television, an Internet Protocol television (IPTV), a smart phone, a tablet PC, Personal Digital Assistant (PDA), or a cellular phone), various display apparatuses used for reproducing images such as advertisements or movies in industrial sites, or other various kinds of audio/video systems.

A display apparatus includes a light source module for converting electrical information into visual information, and the light source module includes a plurality of light sources for emitting light independently.

The plurality of light sources include, for example, Light Emitting Diodes (LEDs) or Organic Light Emitting Diodes (OLEDs). For example, the LEDs or OLEDs are mounted on a circuit board or a substrate.

While the display apparatus is manufactured, used, maintained, or repaired, static electricity may occur to damage the light sources. To prevent or suppress such static electricity, each light source generally includes an electrostatic discharge protection circuit (for example, a Zener diode), together with a LED.

However, lately, the number of light sources is increasing to improve a contrast ratio, and due to an increase in number of light sources, an area assigned to LEDs and Zener diodes becomes narrow.

SUMMARY

Therefore, it is an aspect of the disclosure to provide a display apparatus including a plurality of light sources each including a light emitting diode without a Zener diode.

It is an aspect of the disclosure to provide a display apparatus including an antistatic member for suppressing or preventing a plurality of light sources from being damaged by static electricity generated around the light sources.

According to an aspect of the disclosure, a display apparatus includes: a liquid crystal panel; a substrate; a light source module disposed on the substrate. The light source module includes a light emitting diode disposed on the substrate, a feed pad provided on the substrate, an antistatic pad provided on the substrate; and an insulating dome provided on the substrate and covering the light emitting diode. The antistatic pad is divided into two parts by an outline of the insulating dome.

According to another aspect of the disclosure, a light apparatus includes: a substrate; and a light source module disposed on the substrate. A light source module includes: a light emitting diode disposed on the substrate, a feed pad provided on the substrate, an antistatic pad provided on the substrate; and an insulating dome provided on the substrate and covering the light emitting diode. The antistatic pad is divided into two parts by an outline of the insulating dome.

According to an aspect of the disclosure, the display apparatus including the plurality of light sources each including a light emitting diode without a Zener diode may be provided.

According to an aspect of the disclosure, the display apparatus including the antistatic member positioned around the plurality of light sources to prevent or suppress the light sources from being damaged by static electricity may be provided.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
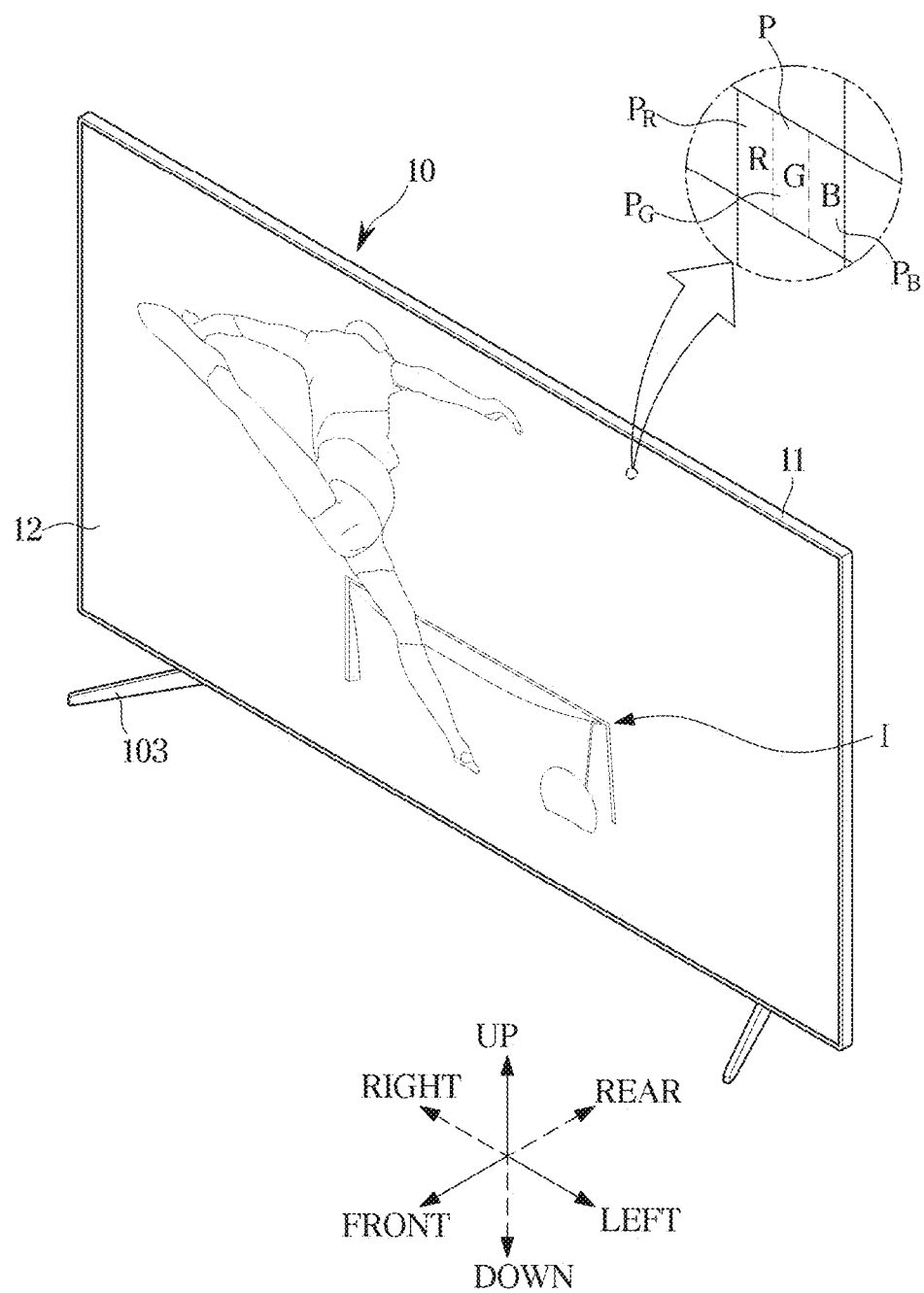
FIG. 1 shows an outer appearance of a display apparatus according to an embodiment of the disclosure.

Like numbers refer to like elements throughout this specification. This specification does not describe all components of the embodiments, and general information in the technical field to which the disclosure belongs or overlapping information between the embodiments will not be described. The terms "portion", "module", "element", and "block", as used herein, may be implemented as software or hardware, and according to embodiments, a plurality of "portion", "module", "element", and "block" may be implemented as a single component, or a single "portion", "module", "element", and "block" may include a plurality of components.

It will be understood that when a component is referred to as being "connected" to another component, it can be directly or indirectly connected to the other component. When a component is indirectly connected to another component, it may be connected to the other component through a wireless communication network.

Also, it will be understood that when the terms "includes," "comprises," "including," and/or "comprising," when used in this specification, specify the presence of a stated component, but do not preclude the presence or addition of one or more other components.

In the entire specification, it will also be understood that when an element is referred to as being "on" or "over" another element, it can be directly on the other element or intervening elements may also be present.

It will be understood that, although the terms "first", "second", etc., may be used herein to describe various elements, these elements should not be limited by these terms. The above terms are used only to distinguish one component from another.

Also, the singular forms "a," "an," and "the" include plural referents unless the context clearly dictates otherwise.

Reference numerals used in operations are provided for convenience of description, without describing the order of the operations, and the operations can be executed in a different order from the stated order unless a specific order is definitely specified in the context.

Hereinafter, an operation principle and embodiments of the disclosure will be described with reference to the accompanying drawings.

FIG. 1 shows an outer appearance of a display apparatus according to an embodiment of the disclosure.

A display apparatus 10 may be an apparatus of processing image signals received from outside and visually displaying the processed signals as images. Hereinafter, a television will be described as an example of the display apparatus 10. However, the display apparatus 10 is not limited to a television. For example, the display apparatus 10 may be implemented as various types, such as a monitor, a portable multimedia device, a portable communication device, etc. That is, the type of the display apparatus 10 is not limited as long as the display apparatus 10 is capable of visually displaying images.

Also, the display apparatus 10 may be a Large Format Display (LFD) that is installed outdoors, such as on the roof of a building or a at bus stop. Herein, the display apparatus 10 is not necessarily limited to an outdoor display, and the display apparatus 10 according to an embodiment of the disclosure may be installed at any place including indoors such as subway stations, shopping malls, movie theaters, places of business, stores, etc.

The display apparatus 10 may receive content data including video data and audio data from various content sources, and output video and audio corresponding to the video data and audio data. For example, the display apparatus 10 may receive content data from a broadcast receiving antenna or a wired cable, from a content reproducing apparatus, or from a content provider's content server.

As shown in FIG. 1, the display apparatus 10 may include a main body 11, a screen 12 for displaying an image I, and a support 103 provided at a lower portion of the main body 11 to support the main body 11.

The main body 11 may form an outer appearance of the display apparatus 10, and components for enabling the display apparatus 10 to display the image I or perform various functions may be installed inside the main body 11. The main body 11 shown in FIG. 1 may be in a shape of a flat plate. However, the shape of the main body 11 is not limited to that shown in FIG. 1. For example, the main body 11 may be in a shape of a curved plate.

The screen 12 may be formed on a front surface of the main body 11 and display an image I. For example, the screen 12 may display a still image or a moving image. Also, the screen 12 may display a 2-Dimensional (2D) planar image or a 3-Dimensional (3D) stereoscopic image using a user's binocular eyes.

On the screen 12, a plurality of pixels P may be formed, and the image I displayed on the screen 12 may be formed by light emitted from the plurality of pixels P. For example, light emitted from the plurality of pixels P may be combined into a mosaic, and formed as the image I on the screen 12.

The plurality of pixels P may emit light having various brightness levels and various colors. For example, each of the plurality of pixels P may include a self-emissive panel (for example, a Light Emitting Diode (LED) panel) capable of itself emitting light, or a non-emissive panel (for example, a Liquid Crystal Display (LCD) panel) capable of transmitting or blocking light emitted by a light source device.

To emit light of various colors, each of the plurality of pixels P may include sub pixels $P_R$, $P_G$, and $P_B$.

The sub pixels may include a red sub pixel $P_R$ capable of emitting red light, a green sub pixel $P_G$ capable of emitting green light, and a blue sub pixel $P_B$ capable of emitting blue light. For example, red light may correspond to light of a wavelength range from about 620 nm (nanometer, one billionth of a meter) to about 750 nm, green light may correspond to light of a wavelength range from about 495 nm to about 570 nm, and blue light may correspond to light of a wavelength range from about 450 nm to about 495 nm.

By a combination of red light from the red sub pixel $P_R$, green light from the green sub pixel $P_G$ and blue light from the blue sub pixel $P_B$, the plurality of pixels P may emit light of various brightness levels and various colors.

Figure 2:
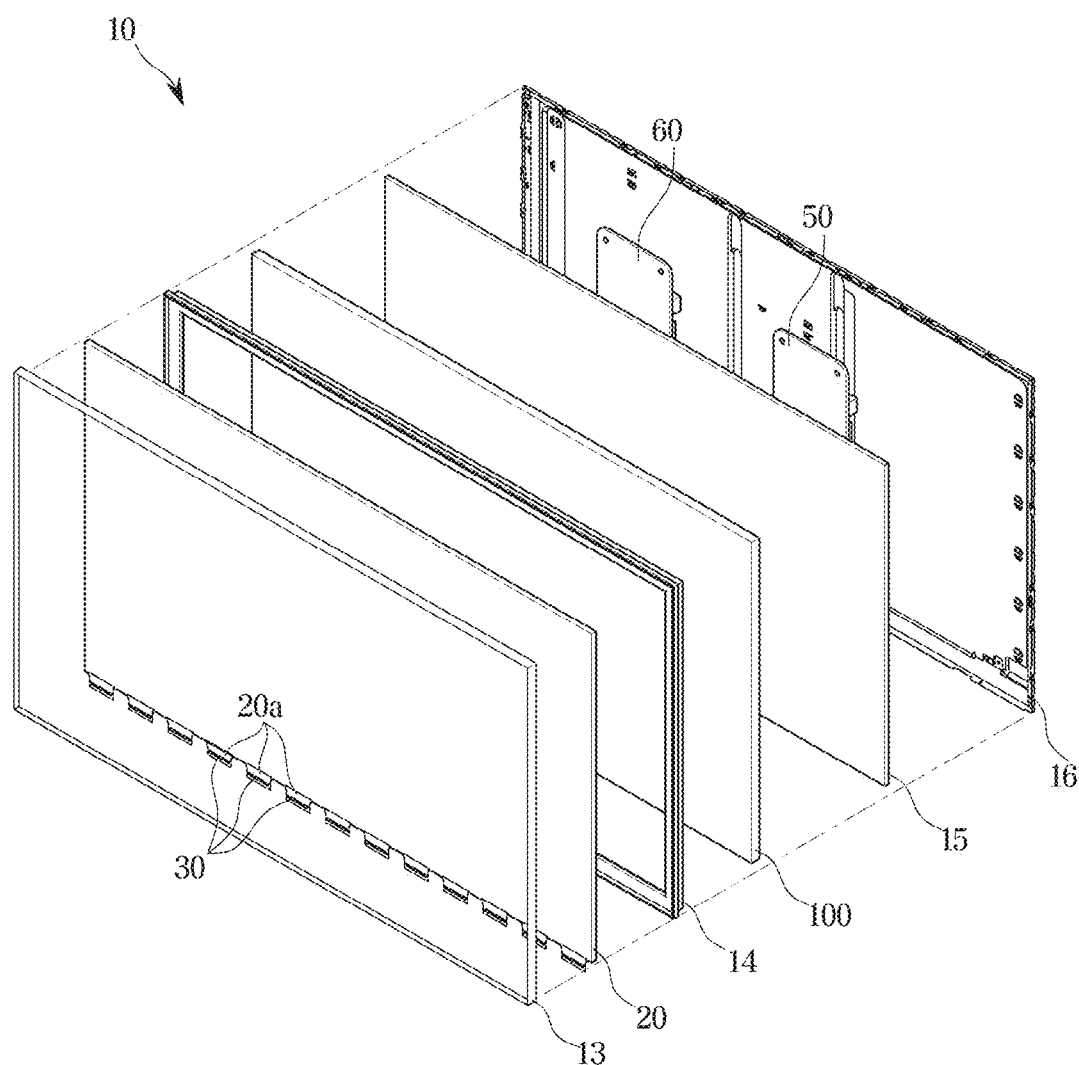
FIG. 2 is an exploded perspective view of a display apparatus according to an embodiment of the disclosure.
Figure 2:
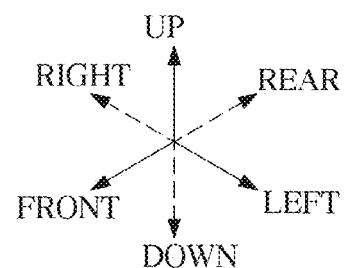

As shown in FIG. 2, various components for generating the image I on the screen 12 may be installed inside the main body 11.

For example, the main body 11 may include a light source device 100 which is a surface light source, a liquid crystal panel 20 for blocking or transmitting light emitted from the light source device 100, a control assembly 50 for controlling operations of the light source device 100 and the liquid crystal panel 20, and a power supply assembly 60 for supplying power to the light source device 100 and the liquid crystal panel 20. Also, the main body 11 may include a bezel 13, a frame middle mold 14, a bottom chassis 15, and a rear cover 16 for supporting and fixing the liquid crystal panel 20, the light source device 100, the control assembly 50, and the power supply assembly 60.

The light source device 100 may include a point light source for emitting monochromatic light or white light, and may refract, reflect, and scatter light to convert light emitted from the point light source into uniform surface light. For example, the light source device 100 may include a plurality of light sources for emitting monochromatic light or white light, a diffuser plate for diffusing light emitted from the plurality of light sources, a reflective sheet for reflecting light emitted from the plurality of light sources and a rear surface of the diffuser plate, and an optical sheet for refracting and scattering light emitted from a front surface of the diffuser plate.

As such, the light source device 100 may emit uniform surface light toward a front direction by refracting, reflecting, and scattering light emitted from the light sources.

A configuration of the light source device 100 will be described in more detail below.

The liquid crystal panel 20 may be positioned in front of the light source device 100, and block or transmit light emitted from the light source device 100 to form an image I.

A front surface of the liquid crystal panel 20 may form the screen 12 of the display apparatus 10 described above, and the liquid crystal panel 20 may form the plurality of pixels P. The plurality of pixels P of the liquid crystal panel 20 may independently block or transmit light of the light source device 100, and light transmitted through the plurality of pixels P may form an image I that is displayed on the screen 12.

Figure 3:
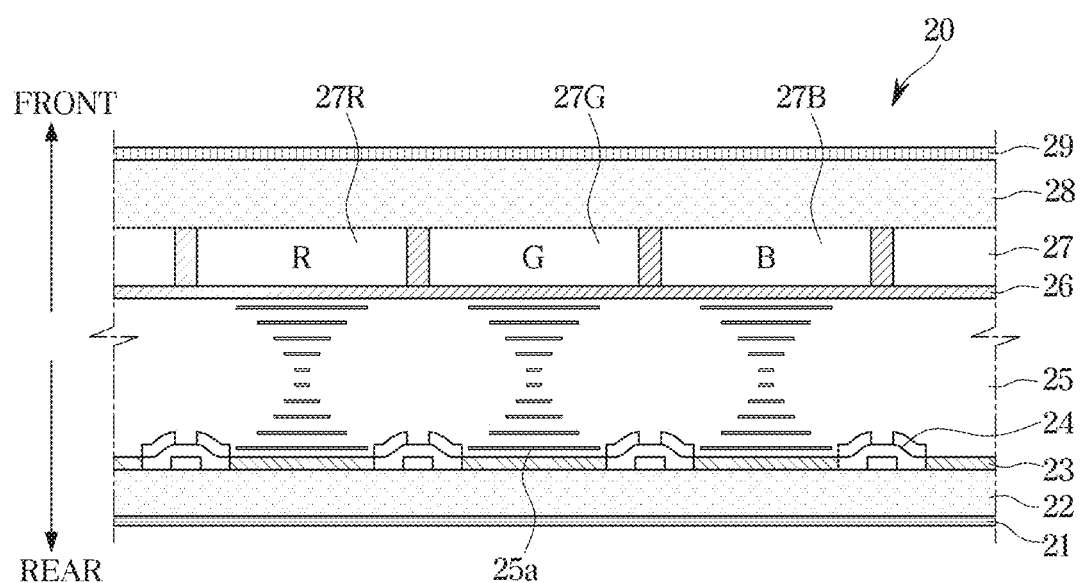
FIG. 3 is a side cross-sectional view of a liquid crystal panel of a display apparatus according to an embodiment of the disclosure.

For example, as shown in FIG. 3, the liquid crystal panel 20 may include a first polarizing film 21, a first transparent substrate 22, a pixel electrode 23, a thin film transistor (TFT) 24, a liquid crystal layer 25, a common electrode 26, a color filter 27, a second transparent substrate 28, and a second polarizing film 29.

The first transparent substrate 22 and the second transparent substrate 28 may fix and support the pixel electrode 23, the thin film transistor 24, the liquid crystal layer 25, the common electrode 26, and the color filter 27. The first and second transparent substrates 22 and 28 may be made of tempered glass or a transparent resin.

On outer surfaces of the first and second transparent substrates 22 and 28, the first polarizing film 21 and the second polarizing film 29 may be respectively positioned.

The first polarizing film 21 and the second polarizing film 29 may transmit specific light and block the other light. For example, the first polarizing film 21 may transmit light having a magnetic field vibrating in a first direction and block the other light. Also, the second polarizing film 29 may transmit light having a magnetic field vibrating in a second direction and block the other light, wherein the second direction may be orthogonal to the first direction. Accordingly, a polarizing direction of light transmitted by the first polarizing film 21 may be orthogonal to a vibration direction of light transmitted by the second polarizing film 29. As a result, light may be generally not transmitted through the first polarizing film 21 and the second polarizing film 29 simultaneously.

The color filer 27 may be positioned on an inner surface of the second transparent substrate 28.

The color filter 27 may include a red filter 27R transmitting red light, a green filter 27G transmitting green light, and a blue filter 27B transmitting blue light, wherein the red filter 27R, the green filter 27G, and the blue filter 27B may be positioned side by side. An area in which the color filter 27 is formed may correspond to the pixels P described above. An area in which the red filter 27R is formed may correspond to the red sub pixel $P_R$, an area in which the green filter 27G is formed may correspond to the green sub pixel $P_G$, and an area in which the blue filter 27B is formed may correspond to the blue sub pixel $P_B$.

On an inner surface of the first transparent substrate 22, the pixel electrode 23 may be positioned, and on an inner surface of the second transparent substrate 28, the common electrode 26 may be positioned.

The pixel electrode 23 and the common electrode 26 may be made of a metal material carrying electricity and may generate an electric field for changing alignment of liquid crystal molecules 25a configuring the liquid crystal layer 25 which will be described below.

The pixel electrode 23 and the common electrode 26 may be made of a transparent material, and transmit light received from outside. For example, the pixel electrode 23 and the common electrode 26 may be made of Indium Tin Oxide (ITO), Indium Zinc Oxide (IZO), an Ag nano wire, a carbon nano tube (CNT), graphene, or 3,4-ethylenedioxythiophene (PEDOT).

On the inner surface of the first transparent substrate 22, the thin film transistor 24 may be positioned.

The thin film transistor 24 may transmit or block current flowing through the pixel electrode 23. For example, by turning-on (closing) or turning-off (opening) of the thin film transistor 24, an electric field may be formed or removed between the pixel electrode 23 and the common electrode 26.

The thin film transistor 24 may be made of poly-silicon and may be formed by a semiconductor process, such as lithography, deposition, ion implantation, etc.

The liquid crystal layer 25 may be formed between the pixel electrode 23 and the common electrode 26, and the liquid crystal layer 25 may be filled with liquid crystal molecules 25a.

Liquid crystal means an intermediate state between a solid (crystal) state and a liquid state. Most liquid crystal materials are organic compounds. A molecule of a liquid crystal material is in the shape of a thin, long rod. Also, the molecular arrangement of the liquid crystal material is irregular when seen in a specific direction, but appears as a regular crystalloid pattern when seen in another direction. Accordingly, the liquid crystal has both the fluidity of a liquid and the optical anisotropy of a crystal (solid).

Also, liquid crystal may show an optical property according to a change in electric field. For example, the direction of the molecular arrangement of liquid crystal may change according to a change in electric field. In the case in which an electric field is formed in the liquid crystal layer 25, liquid crystal molecules 115a of the liquid crystal layer 25 may be arranged according to the direction of the electric field, and in the case in which no electric field is formed in the liquid crystal layer 25, the liquid crystal molecules 115a may be arranged irregularly or according to an alignment layer (not shown). As a result, the optical property of the liquid crystal layer 25 may change according to the presence/absence of an electric field passing through the liquid crystal layer 25.

In one edge of the liquid crystal panel 20, a cable 20a for transmitting image data to the liquid crystal panel 20, and a display driver integrated circuit (hereinafter, referred to as a 'driver IC') 30 for processing digital image data and outputting an analog image signal may be positioned.

The cable 20a may electrically connect the control assembly 50 or the power supply assembly 60 to the driver IC 30, and also, electrically connect the driver IC 30 to the liquid crystal panel 20. The cable 20a may include a flexible flat cable or a film cable.

The driver IC 30 may receive image data and power from the control assembly 50 or the power supply assembly 60 through the cable 20a and may transmit image data and driving current to the liquid crystal panel 20 through the cable 20a.

Also, the cable 20a and the driver IC 30 may be implemented as a film cable, a chip on film (COF), a tape carrier packet (TCP), etc. In other words, the driver IC 30 may be positioned on the cable 20a, although it is not limited thereto. Also, the driver IC 30 may be positioned on the liquid crystal panel 20.

The control assembly 50 may include a control circuit for controlling operations of the liquid crystal panel 20 and the light source device 100. The control circuit may process image data received from an external content source, transmit the image data to the liquid crystal panel 20, and transmit dimming data to the light source device 100.

The power supply assembly 60 may supply power to the liquid crystal panel 20 and the light source device 100 such that the light source device 100 outputs surface light. Additionally, the liquid crystal panel 20 may block or transmit light emitted from the light source device 100.

The control assembly 50 and the power supply assembly 60 may be implemented as a printed circuit board with various circuits mounted on the printed circuit board. For example, a power circuit may include a condenser, a coil, a resistor, a processor, and a power circuit board on which they are mounted. Also, a control circuit may include a memory, a processor, and a control circuit board on which they are mounted.

Hereinafter, the light source device 100 will be described.

Figure 4:
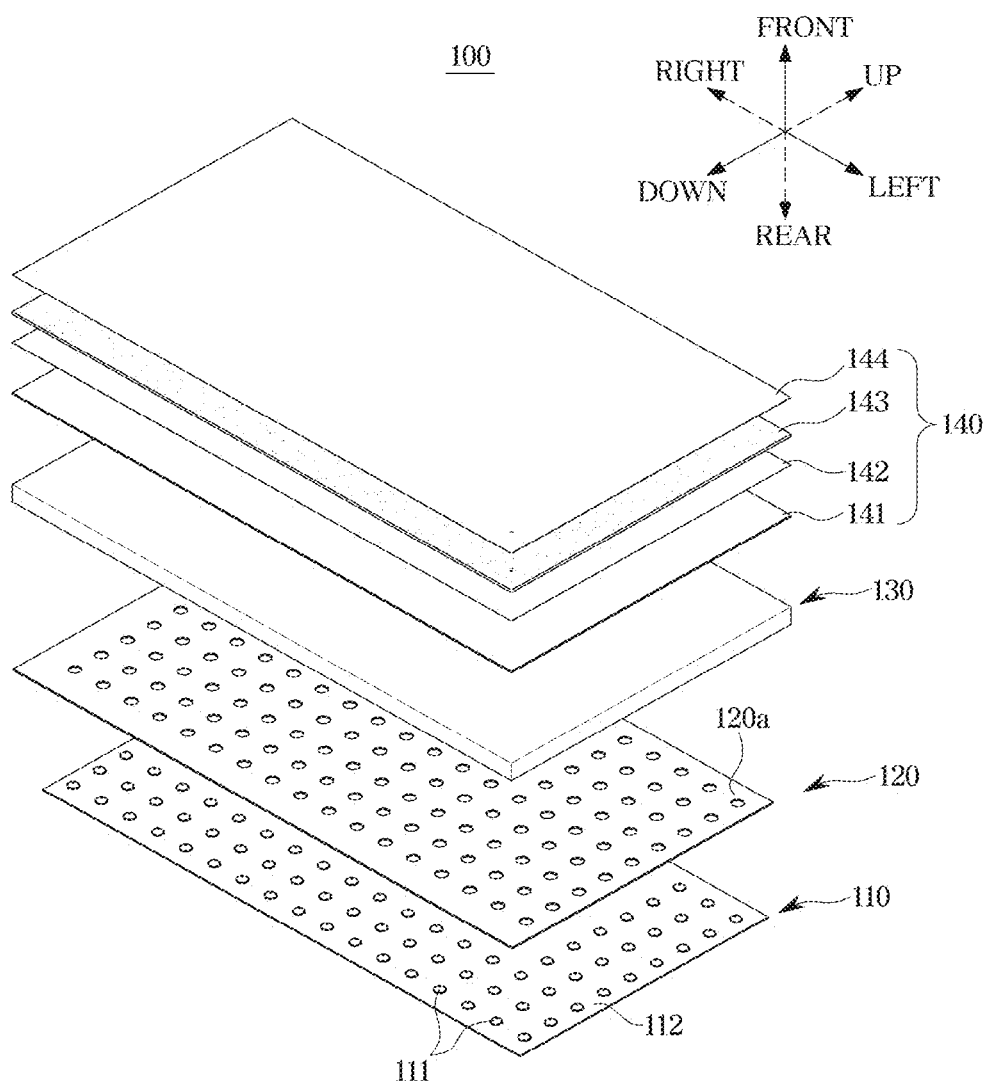
FIG. 4 is an exploded perspective view of a light source device according to an embodiment of the disclosure.
Figure 5:
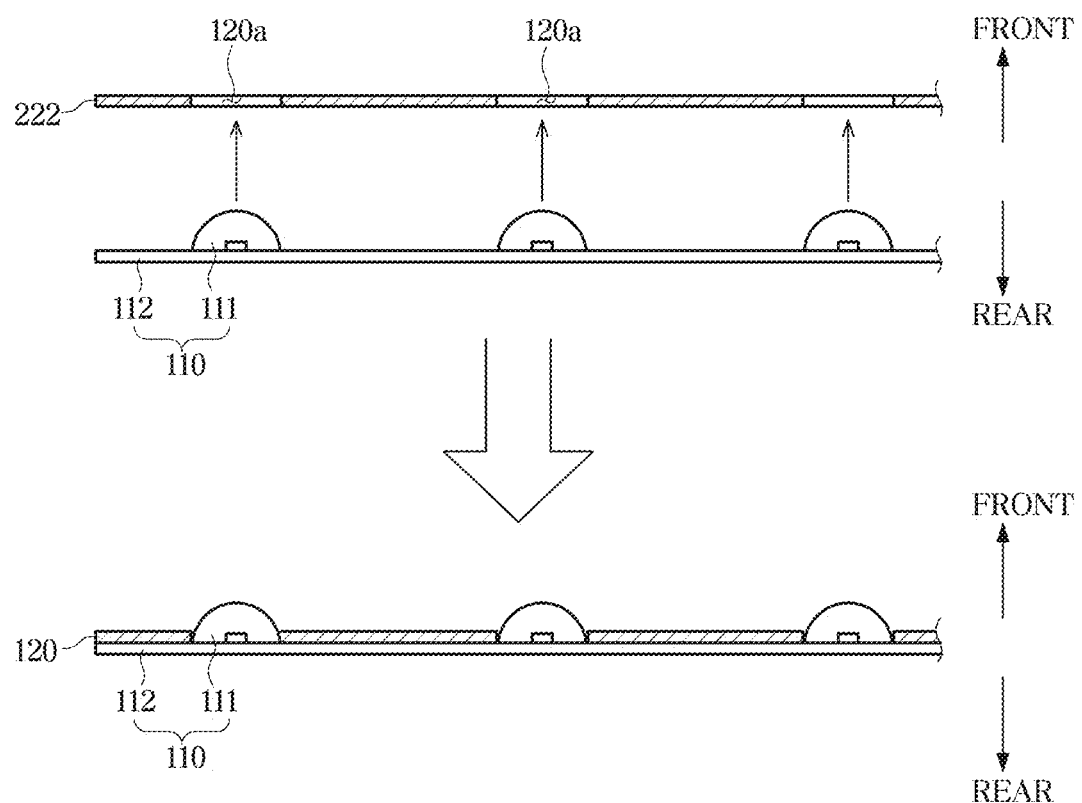
FIG. 5 shows coupling of a reflective sheet and a light source module included in a light source device according to an embodiment of the disclosure.

FIG. 4 is an exploded perspective view of a light source device according to an embodiment of the disclosure. FIG. 5 shows coupling of a reflective sheet and a light source module included in a light source device according to an embodiment of the disclosure.

The light source device 100 may include a light source module 110 for generating light, a reflective sheet 120 for reflecting light, a diffuser plate 130 for uniformly diffusing light, and an optical sheet 140 for improving brightness of emitted light.

The light source module 110 may include a plurality of light sources 111 for emitting light, and a substrate 112 for supporting/fixing the plurality of light sources 111.

The plurality of light sources 111 may be arranged in a preset pattern to emit light with uniform brightness. The plurality of light sources 111 may be arranged such that distances between a light source and its neighboring light sources are the same.

For example, as shown in FIG. 4, the plurality of light sources 111 may be arranged in rows and columns positioned at regular intervals. Accordingly, the plurality of light sources 111 may be arranged such that four adjacent light sources have a substantially square shape. Also, a light source may be adjacent to four light sources, and the distances between the light source and the four adjacent light sources may be substantially the same.

According to another example, the plurality of light sources 111 may be arranged in a plurality of rows, and a light source belonging to each row may be positioned on a center line of two light sources belonging to its adjacent row. Accordingly, the plurality of light sources 111 may be arranged such that three adjacent light sources form substantially an equilateral triangle. In this case, a light source may be adjacent to six light sources, and distances between the light source and the six light sources may be substantially the same.

However, an arrangement pattern of the plurality of light sources 111 is not limited to the above-described patterns, and the plurality of light sources 111 may be arranged in various patterns as long as the patterns emit light with uniform brightness.

Each light source 111 may adopt a device capable of emitting, upon receiving power, monochromatic light (light having a specific wavelength, for example, blue light) or white light (mixed light of red light, green light, and blue light) in various directions. For example, the light source 111 may include a light emitting diode.

The substrate 112 may fix the plurality of light sources 111 such that the light sources 111 do not change their positions. Also, the substrate 112 may supply power to the individual light sources 111 to enable the light sources 111 to emit light.

The substrate 112 may be configured with a synthetic resin, tempered glass, or a printed circuit board (PCB), which fixes the plurality of light sources 111 and on which a conductive power supply line for supplying power to the light sources 111 is formed.

The reflective sheet 120 may reflect light emitted from the plurality of light sources 111 in a front direction or in a direction that is close to the front direction.

In the reflective sheet 120, a plurality of through holes 120a may be formed at locations respectively corresponding to the plurality of light sources 111 of the light source module 110. Also, the light sources 111 of the light source module 110 may protrude through the through holes 120a in the front direction from the reflective sheet 120.

For example, as shown in an upper part of FIG. 5, the plurality of light sources 111 of the light source module 110 may be inserted into the plurality of through holes 120a formed in the reflective sheet 120 during a process of assembling the reflective sheet 120 with the light source module 110. Accordingly, as shown in a lower part of FIG. 5, the substrate 112 of the light source module 110 may be positioned behind the reflective sheet 120, while the plurality of light sources 111 of the light source module 110 may be positioned in front of the reflective sheet 120.

Accordingly, the plurality of light sources 111 may emit light in front of the reflective sheet 120.

The plurality of light sources 111 may emit light in various directions in front of the reflective sheet 120. The light may be emitted from the light sources 111 toward the reflective sheet 120, as well as toward the diffuser plate 130, and the reflective sheet 120 may reflect the light emitted toward the reflective sheet 120 toward the diffuser plate 130.

Light emitted from the light sources 111 may pass through various objects, such as the diffuser plate 130 and the optical sheet 140. While incident light passes through the diffuser plate 130 and the optical sheet 140, a part of the incident light may be reflected from surfaces of the diffuser plate 130 and the optical sheet 140. The reflective sheet 120 may reflect light reflected by the diffuser plate 130 and the optical sheet 140.

The diffuser plate 130 may be positioned in front of the optical module 110 and the reflective sheet 120 and uniformly diffuse light emitted from the light sources 111 of the light source module 110.

As described above, the plurality of light sources 111 may be positioned at preset locations on a rear surface of the light source device 100. Although the plurality of light sources 111 are arranged at equidistance intervals on the rear surface of the light source device 100, non-uniformity of brightness may occur according to the positions of the plurality of light sources 111.

The diffuser plate 130 may diffuse light emitted from the plurality of light sources 111 within the diffuser plate 130 to remove non-uniformity of brightness caused by the plurality of light sources 111. In other words, the diffuser plate 130 may uniformly emit non-uniform light emitted from the plurality of light sources 111 through the front surface.

The optical sheet 140 may include various sheets for improving brightness and uniformity of brightness. For example, the optical sheet 140 may include a diffuser sheet 141, a first prism sheet 142, a second prism sheet 143, and a reflective polarizing sheet 144.

The diffuser sheet 141 may diffuse light for uniformity of brightness. Light emitted from each light source 111 may be diffused by the diffuser plate 130, and again diffused by the diffusing sheet 141 included in the optical sheet 140.

The first and second prism sheets 142 and 143 may concentrate the light diffused by the diffusing sheet 141 to increase brightness. The first and second prism sheets 142 and 143 may include a prism pattern being in a shape of a trigonal prism, and a plurality of prism patterns may be arranged to be adjacent to each other, thereby forming a plurality of bands.

The reflective polarizing sheet 144 may be a kind of a polarizing film that transmits a part of incident light and reflects the other portion of the incident light to improve brightness. For example, the reflective polarizing sheet 144 may transmit polarized light traveling in a preset polarization direction of the reflective polarizing sheet 144 and reflect polarized light traveling in a polarization direction that is different from the preset polarization direction of the reflective polarizing sheet 144. Also, light reflected by the reflective polarizing sheet 144 may be recycled inside the light source device 100, and brightness of the display apparatus 10 may be improved by such light recycle.

The optical sheet 140 is not limited to the sheets or films shown in FIG. 4, and may include various sheets or films, such as a protection sheet, etc.

Figure 6:
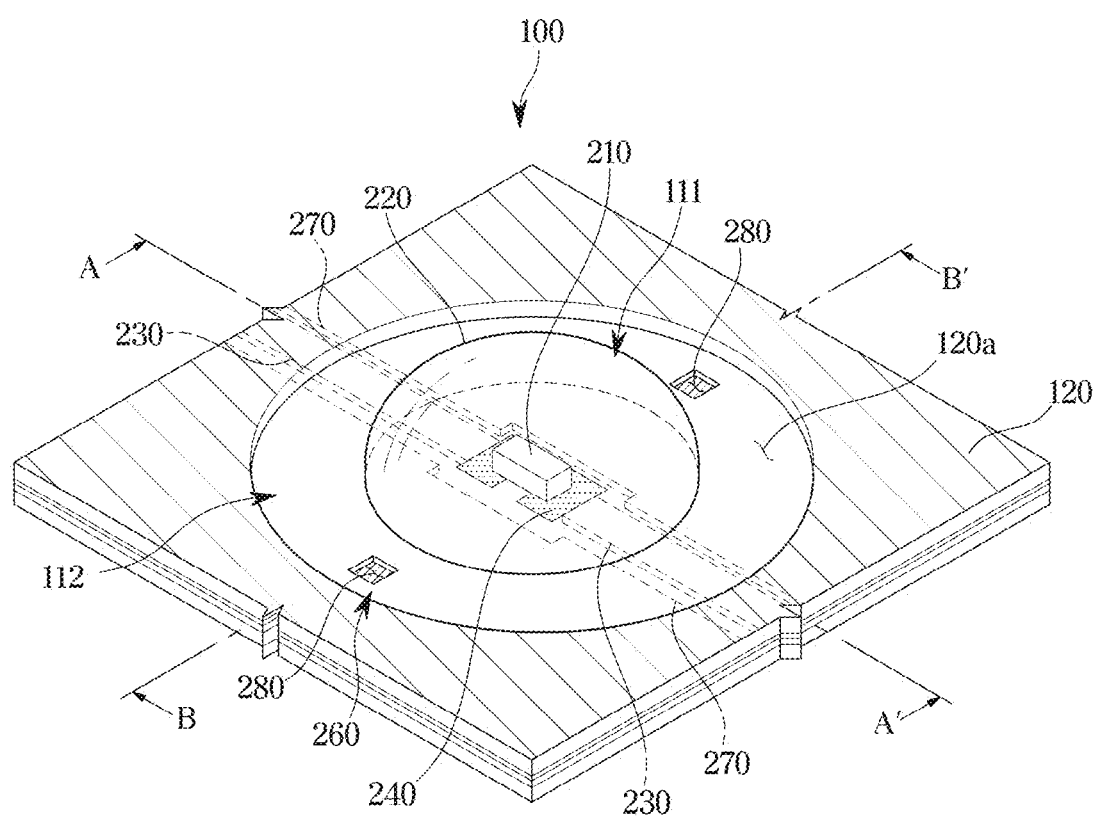
FIG. 6 is a perspective view of a light source included in a light source device according to an embodiment of the disclosure.
Figure 7:
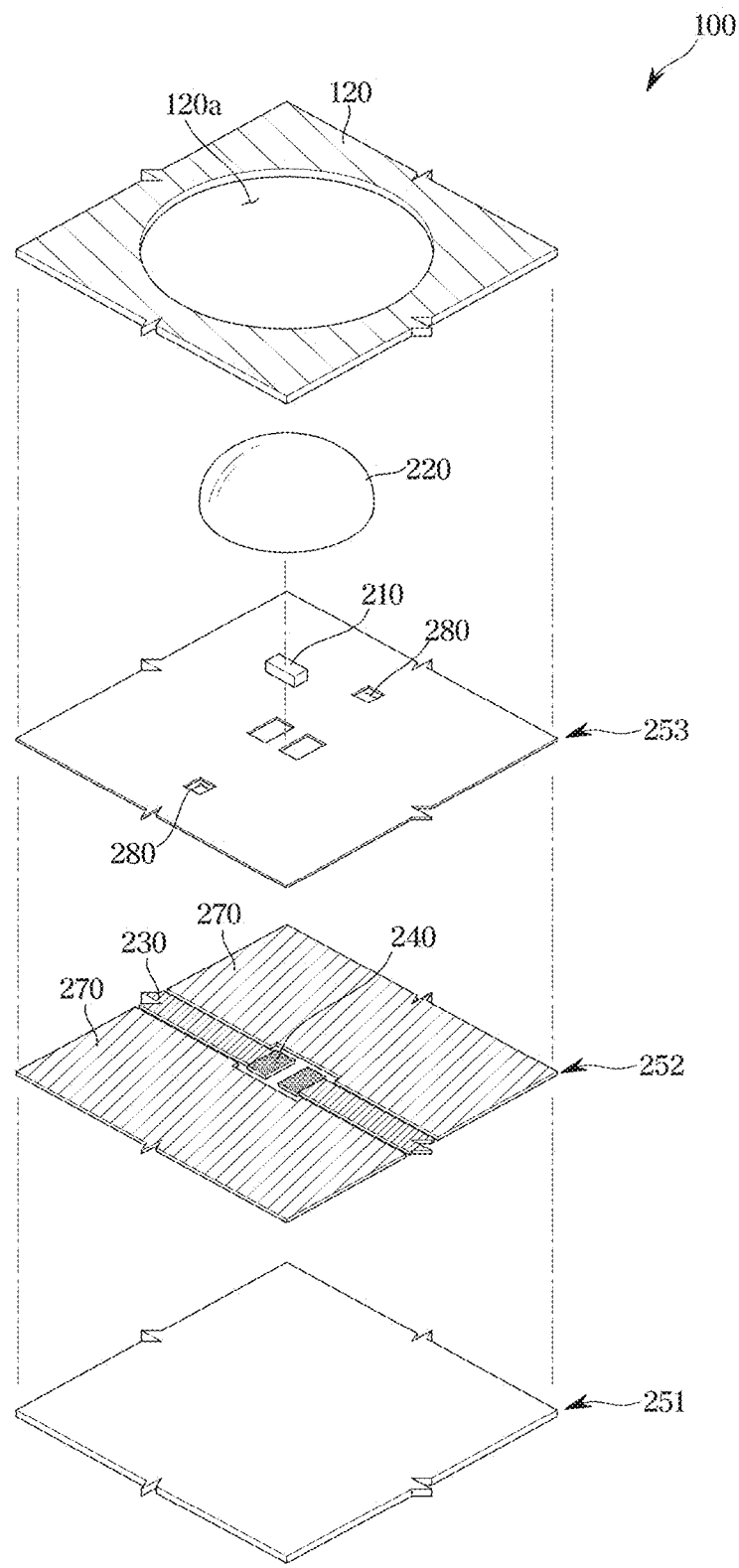
FIG. 7 is an exploded perspective view of the light source shown in FIG. 6 according to an embodiment of the disclosure.
Figure 8:
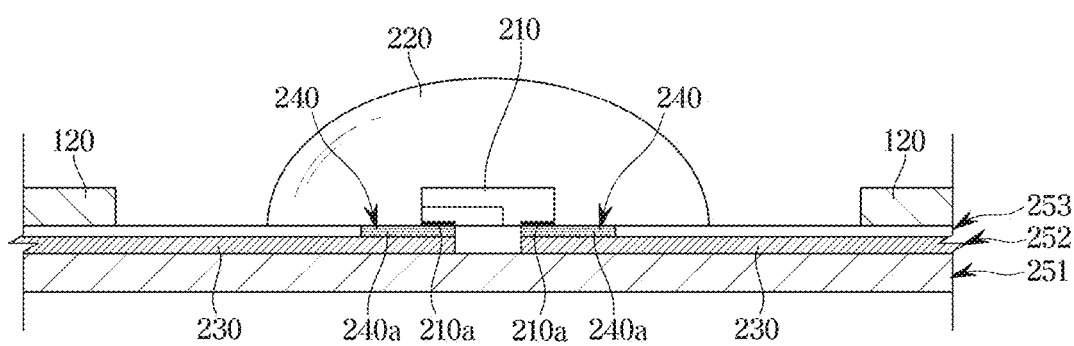
FIG. 8 is a side cross-sectional view of the light source shown in FIG. 6, taken in a A-A' direction of FIG. 6 according to an embodiment of the disclosure.
Figure 9:
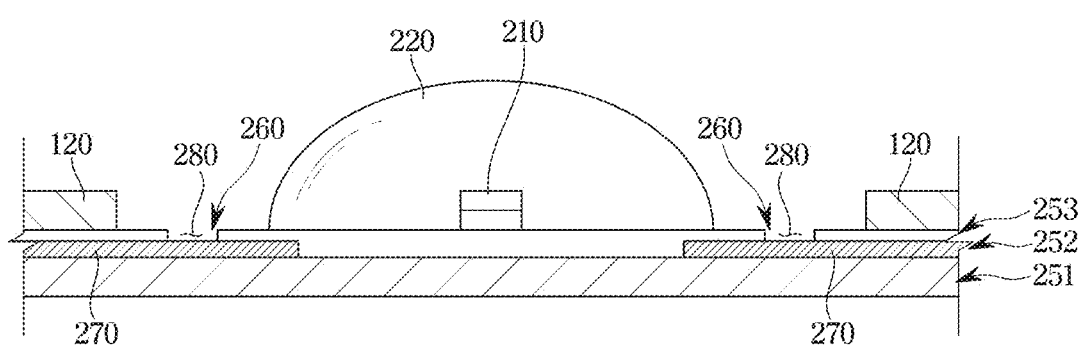
FIG. 9 is a side cross-sectional view of the light source shown in FIG. 6, taken in a B-B' direction of FIG. 6 according to an embodiment of the disclosure.
Figure 10:
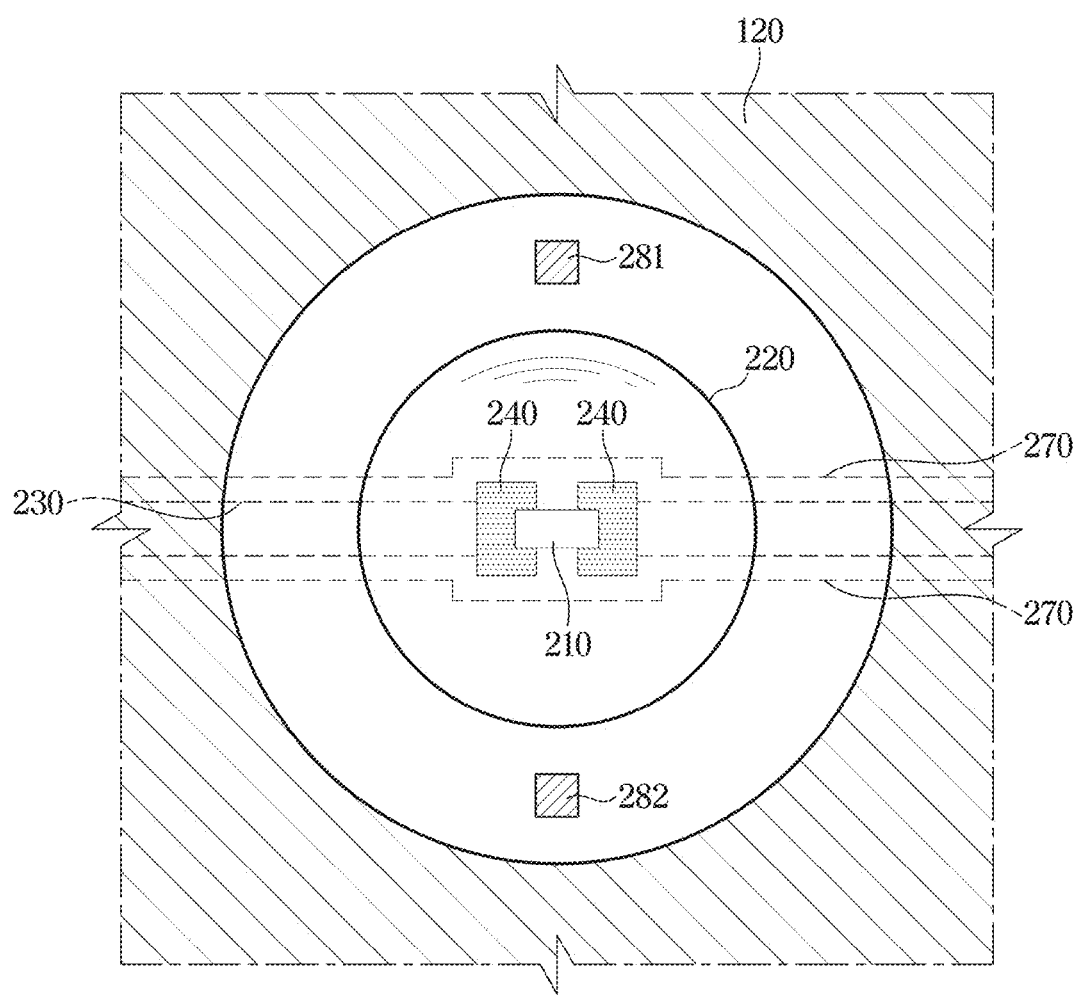
FIG. 10 is a top view of a light source included in a light source device according to an embodiment of the disclosure.
Figure 11:
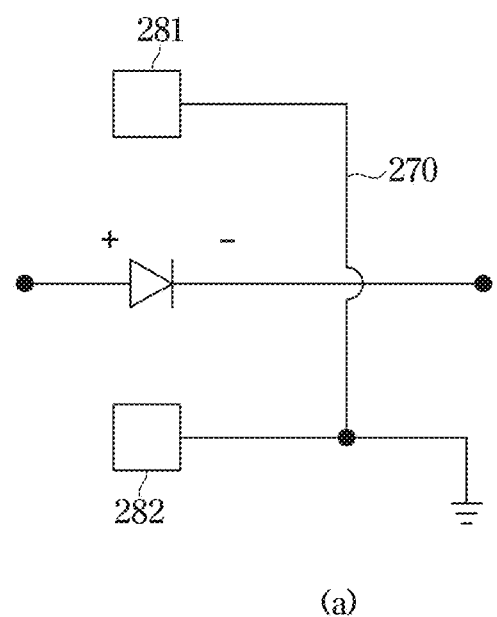
FIG. 11 shows equivalent circuits of a light source included in a light source device according to an embodiment of the disclosure.
Figure 11:
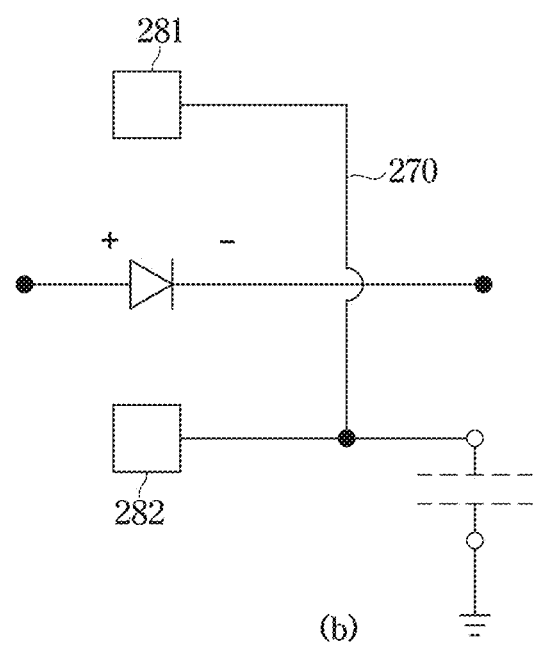
Figure 12:
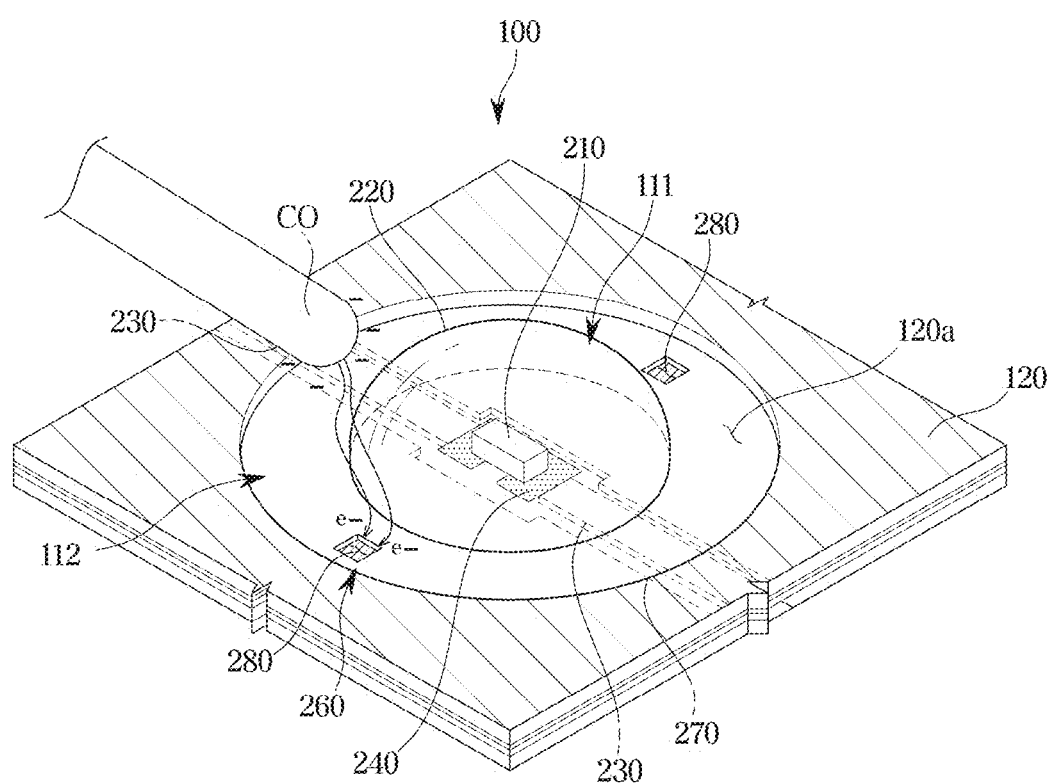
FIG. 12 shows an example of electrostatic discharge in a light source included in a light source device according to an embodiment of the disclosure.

FIG. 6 is a perspective view of a light source included in a light source device according to an embodiment of the disclosure. FIG. 7 is an exploded perspective view of the light source shown in FIG. 6. FIG. 8 is a side cross-sectional view of the light source shown in FIG. 6, taken in a A-A' direction of FIG. 6. FIG. 9 is a side cross-sectional view of the light source shown in FIG. 6, taken in a B-B' direction of FIG. 6. FIG. 10 is a top view of a light source included in a light source device according to an embodiment of the disclosure. FIG. 11 shows equivalent circuits of a light source included in a light source device according to an embodiment of the disclosure. FIG. 12 shows an example of electrostatic discharge in a light source included in a light source device according to an embodiment of the disclosure.

Hereinafter, the light sources 111 of the light source device 100 will be described with reference to FIGS. 6, 7, 8, 9, 10, 11, and 12.

As described above, the light source module 110 may include the plurality of light sources 111. The plurality of light sources 111 may protrude through the through holes 120a from behind the reflective sheet 120 toward the front direction of the reflective sheet 120. Accordingly, as shown in FIGS. 6 and 7, the light sources 111 and some areas of the substrate 112 may be exposed in the front direction of the reflective sheet 120 through the through holes 120a.

The light sources 111 may include electrical/mechanical structures located at areas defined by the through holes 120a of the reflective sheet 120.

Each of the plurality of light sources 111 may include a light emitting diode 210 and an optical dome 220.

To improve uniformity of surface light emitted by the light source device 100 and improve a contrast rate by local dimming, the number of the light sources 111 may increase. Due to an increase in number of the light sources 111, an area occupied by each of the plurality of light sources 111 may become narrow.

To reduce an area occupied by each of the plurality of light sources 111, the light source 111 may not include an antistatic circuit (for example, a Zener diode) for preventing or suppressing the light emitting diode 210 from being damaged by electrostatic discharge. In other words, the light source 111 may not include a Zener diode connected in parallel with the light emitting diode 210.

The light emitting diode 210 may include a P-type semiconductor and an N-type semiconductor for emitting light by recombination of holes and electrons. Also, the light emitting diode 210 may include a pair of electrodes 210a for supplying holes and electrons to the P-type semiconductor and the N-type semiconductor.

The light emitting diode 210 may convert electrical energy into light energy. In other words, the light emitting diode 210 may emit light having a maximum strength in a preset wavelength to which power is supplied. For example, the light emitting diode 210 may emit blue light having a peak value in a wavelength (for example, a wavelength ranging from 450 nm to 495 nm) that displays a blue color.

The light emitting diode 210 may be attached directly on the substrate 112 by a Chip On Board (COB) method. In other words, the light sources 111 may include the light emitting diode 210 in which a light emitting diode chip or a light emitting diode die is attached directly on the substrate 112 without any packaging.

To reduce an area occupied by the light emitting diode 210, the light emitting diode 210 may be manufactured as a flip chip type including no Zener diode. The light emitting diode 210 of the flip chip type may be manufactured by welding without using an intermediate medium such as a metal lead (wire) or a ball grid array (BGA), upon attaching the light emitting diode 210 being a semiconductor device onto the substrate 112, an electrode pattern of a semiconductor device as it is on the substrate 112.

As such, by omitting a metal lead (wire) or a ball grid array, each light source 111 including the light emitting diode 210 of the flip chip type may be miniaturized.

To miniaturize the light source 111, the light source module 110 in which the light emitting diode 210 of the flip chip type is attached on the substrate 112 by the COB method may be manufactured.

On the substrate 112, a feed line 230 and a feed portion 240 for supplying power to the light emitting diode 210 of the flip chip type may be provided.

On the substrate 112, the feed line 230 for supplying an electrical signal and/or power from the control assembly 50 and/or the power supply assembly 60 to the light emitting diode 210 may be provided.

As shown in FIG. 8, the substrate 112 may be formed by alternately stacking an insulation layer 251 having non-conductivity and a conduction layer 252 having conductivity.

On the conduction layer 252, lines or patterns through which power and/or an electrical signal is transmitted may be formed. The conduction layer 252 may be formed of various materials having electrical conductivity. For example, the conduction layer 252 may be formed of various metal materials, such as copper (Cu), tin (Sn), aluminum (Al), or an alloy thereof.

A dielectric layer of the insulation layer 251 may insulate between the lines or patterns of the conduction layer 252. The insulation layer 251 may be formed of a dielectric for electrical insulation, for example, FR-4.

The feed line 230 may be implemented by the lines or patterns formed on the conduction layer 252.

The feed line 230 may be electrically connected to the light emitting diode 210 through the feed portion 240.

The feed portion 240 may be formed by exposing the feed line 230 to outside.

On an outermost surface of the substrate 112, a protection layer 253 for preventing the substrate 112 from being damaged by an external impact, a chemical action (for example, corrosion, etc.), and/or an optical action may be formed. The protection layer 253 may include a Photo Solder Resist (PSR).

As shown in FIG. 8, the protection layer 253 may cover the feed line 230 to prevent the feed line 230 from being exposed to the outside.

To enable the feed line 230 to electrically contact the light emitting diode 210, a window for exposing a portion of the feed line 230 to the outside may be formed in the protection layer 253. The portion of the feed line 230, exposed to the outside by the window of the protection layer 253, may form the feed portion 240.

On the feed portion 240, a conductive adhesive material 240a may be applied for an electrical contact of the feed line 230 exposed to the outside to the electrode 210a of the light emitting diode 210. The conductive adhesive material 240a may be applied in the window of the protection layer 253.

The electrode 210a of the light emitting diode 210 may contact the conductive adhesive material 240a, and the light emitting diode 210 may be electrically connected to the feed line 230 through the conductive adhesive material 240a.

The conductive adhesive material 240a may include, for example, a solder having electrical conductivity, although it is not limited thereto. Also, the conductive adhesive material 240a may include electrically conductive epoxy adhesives having electrical conductivity.

Power may be supplied to the light emitting diode 210 through the feed line 230 and the feed portion 240, and the light emitting diode 210 may receive the power to emit light. A pair of feed portions 240 respectively corresponding to the pair of electrodes 210a included in the light emitting diode 210 of the flip chip type may be provided.

The optical dome 220 may cover the light emitting diode 210. The optical dome 220 may prevent or suppress the light emitting diode 210 from being damaged by an external mechanical action and/or by a chemical action.

The optical dome 220 may be in a shape of a dome resulting from cutting, for example, a sphere with a plane not including a center of the sphere, or in a shape of a hemisphere resulting from cutting a sphere with a plane including a center of the sphere. A vertical section of the optical dome 220 may be in a shape of, for example, a segment of a circle or a semicircle.

The optical dome 220 may be formed of silicon or an epoxy resin. For example, the optical dome 220 may be formed by discharging molten silicon or a molten epoxy resin onto the light emitting diode 210 through a nozzle, etc. and then hardening the discharged silicon or epoxy resin.

Accordingly, the optical dome 220 may have various shapes according to viscosity of liquid silicon or an epoxy resin. For example, in the case in which the optical dome 220 is manufactured with silicon having a thixotropic index of about 2.7 to about 3.3 (preferably, 3.0), the optical dome 220 may have a dome ratio of about 2.5 to about 3.1 (preferably, 2.8), wherein the dome ratio represents a ratio (the height of the dome/the diameter of the base side of the dome) of a height of the dome with respect to a diameter of a base side of the dome. For example, a diameter of the base side of the optical dome 220 manufactured with silicon having a thixotropic index of about 2.7 to about 3.3 (preferably, 3.3) may be about 2.5 mm, and a height of the optical dome 220 may be about 0.7 mm.

The optical dome 220 may be optically transparent or translucent. Light emitted from the light emitting diode 210 may pass through the optical dome 220 and be emitted to the outside.

At this time, the optical dome 220 being in a shape of a dome may refract the light, like a lens. For example, light emitted from the light emitting diode 210 may be refracted by the optical dome 220 and dispersed.

As such, the optical dome 220 may protect the light emitting diode 210 from an external mechanical action, chemical action, and/or electrical action, and disperse light emitted from the light emitting diode 210.

Around the optical dome 220, an antistatic member 260 for protecting the light emitting diode 210 from electrostatic discharge may be formed.

The antistatic member 260 may absorb an electrical impact caused by electrostatic discharge generated around the optical dome 220.

As described above, the optical dome 220 may protect the light emitting diode 210 from an external electrical action. Charges generated by electrostatic discharge may not pass through the optical dome 220 and may flow along an outer surface of the optical dome 220. The charges flowing along the outer surface of the optical dome 220 may arrive at the light emitting diode 210 along a boundary between the optical dome 220 and the substrate 112. The light emitting diode 210 may be damaged by an electrical impact caused by the charges permeated along the boundary between the optical dome 220 and the substrate 112. To prevent or suppress such a flow of charges (i.e. current), the antistatic member 260 may be provided around the optical dome 220.

The antistatic member 260 may include an antistatic line 270 and an antistatic portion 280.

The antistatic line 270 may provide a path of current caused by electrostatic discharge generated around the optical dome 220. In other words, the antistatic line 270 may guide charges generated by electrostatic discharge to flow to the ground. The antistatic line 270 may be formed of the same material as the feed line 230. For example, the antistatic line 270 may be formed of various metal materials, such as copper (Cu), tin (Sn), aluminum (Al), or an alloy thereof.

For example, the substrate 112 may be formed by alternately stacking the insulation layer 251 having non-conductivity and the conduction layer 252 having conductivity. The conduction layer 252 may be formed of various metal materials, such as copper (Cu), tin (Sn), aluminum (Al), or an alloy thereof.

The antistatic line 270 may be implemented by a line or pattern formed on the conduction layer 272.

As described in FIG. 9, the antistatic line 270 may be exposed to the outside through the antistatic portion 280.

The protection layer 253 may cover the antistatic line 270 to prevent the antistatic line 270 from being exposed to the outside. In the protection layer 253, a window may be formed to form the antistatic portion 280 for capturing current generated by electrostatic discharge. The antistatic line 270 may be exposed to the outside by the window of the protection layer 253, and a portion of the antistatic line 270 exposed to the outside may form the antistatic portion 280.

As such, the antistatic portion 280 may be formed by exposing a portion of the antistatic line 270 to the outside. The antistatic portion 280 may be provided separately from the feed portion 240 contacting the light emitting diode 210, and the antistatic portion 280 may not contact the light emitting diode 210.

As shown in FIG. 10, the antistatic portion 280 may include a first antistatic portion 281 and a second antistatic portion 282. The first antistatic portion 281 and the second antistatic portion 282 may be positioned to both sides of the optical dome 220.

The first antistatic portion 281 and the second antistatic portion 282 may be maximally spaced from each other on a circumference of an virtual circle surrounding the light source 111. For example, the first antistatic portion 281 and the second antistatic portion 282 may be positioned to form an angle of about 180 degrees with respect to each other along a circumference of an virtual circle surrounding the optical dome 220.

However, an arrangement of the first antistatic portion 281 and the second antistatic portion 282 is not limited to that shown in FIG. 10, and the first antistatic portion 281 and the second antistatic portion 282 may have any arrangement capable of preventing or suppressing current caused by electrostatic discharge from flowing to the light emitting diode 210 along the feed line 230 or the boundary between the optical dome 220 and the substrate 112. For example, the first antistatic portion 281 and the second antistatic portion 282 may be arranged to form an angle of about 90 degrees or 120 degrees with respect to each other along a circumference of an virtual circle surrounding the optical dome 220.

A size of the antistatic portion 280 may depend on various factors. For example, a large size of the antistatic portion 280 may increase a potential difference capable of preventing or suppressing current generated by electrostatic discharge from flowing to the light emitting diode 210. In other words, as the size of the antistatic portion 280 increases, antistatic performance of the antistatic portion 280 may be improved.

Meanwhile, as the size of the antistatic portion 280 increases, optical interference of the antistatic portion 280 may increase accordingly. For example, in the case in which the antistatic portion 270 is formed of copper, the antistatic portion 280 may have an intrinsic color (for example, brown) of copper. In this case, monochromatic light (for example, blue light) emitted from the light source 111 may be reflected from the antistatic portion 280.

While the monochromatic light is reflected from the antistatic portion 280, the intrinsic color of the antistatic portion 280 may be added. For example, monochromatic light emitted from the light source 111 may be blue light having a peak value in a wavelength range from 450 nm to 495 nm. In this case, a spectrum of light reflected from the antistatic portion 280 may have a plurality of peaks, and at least some of the plurality of peaks may deviate from the wavelength range from 450 nm to 495 nm. In other words, due to the antistatic portion 280, light having a peak deviating from the wavelength range of monochromatic light may be emitted.

As such, due to the antistatic portion 280, a spectrum of light emitted from the light source 111 may be distorted, which may reduce a color gamut of the display apparatus 10. Furthermore, the distortion of the spectrum of light emitted from the light source 111 may cause a mura (unevenness) phenomenon.

Accordingly, the size of the antistatic portion 280 may be determined by considering antistatic performance and a color distortion.

The size of the antistatic portion 280 determined by considering antistatic performance may depend on a size of the optical dome 220.

A ratio of an area of the antistatic portion 280 to an area of the base side of the optical dome 220 may be preferably at least 1:0.0016 or more. In the case in which a diameter of the base side of the optical dome 220 is 2.5 mm (a radius of 1250 μm and an area of about 4,900,000 μm$^2$), an area of the antistatic portion 280 may be about 7,900 μm$^2$ or more. In the case in which the antistatic portion 280 is in a shape of a circle, a diameter of the antistatic portion 280 may be about 50 μm or more. Also, in the case in which the antistatic portion 280 is in a shape of a square, a length of a side of the antistatic portion 280 may be about 90 μm or more. For example, the area of the antistatic portion 280 may be preferably about 62,500 μm$^2$ (a ratio of the area of the antistatic portion 280 to the area of the base side of the optical dome 220 is about 1:0.013). In the case in which the antistatic portion 280 is in a shape of a circle, a diameter of the antistatic portion 280 may be preferably about 140 μm. Also, in the case in which the antistatic portion 280 is in a shape of a square, a length of a side of the antistatic portion 280 may be preferably about 250 μm.

The above-described ratios are examples of a ratio of an area of the antistatic portion 280 to an area of the base side of the optical dome 220, and a ratio of an area of the antistatic portion 280 to an area of the base side of the optical dome 220 is not limited to the above-described examples.

A location (a distance to the optical dome 220) of the antistatic portion 280, which is determined by considering antistatic performance, may depend on the size of the optical dome 220.

The antistatic portion 280 may have higher antistatic performance at a closer distance to the outer surface of the optical dome 220. However, in the case in which the antistatic portion 280 is positioned to the inner side from the outer surface of the optical dome 220, optical interference may occur. Accordingly, the antistatic portion 280 may be preferably positioned to the outer side from an outline of the optical dome 220. At least one portion of the antistatic portion 280 may be preferably exposed outside an area defined by the optical dome 220.

Also, to prevent or suppress charges generated by electrostatic discharge from arriving at the feed portion 240, it may be preferable that a shortest distance from the outline of the optical dome 220 to the antistatic portion 280 is shorter than a shortest distance from the outline of the optical dome 220 to the feed portion 240.

The shortest distance from the outline of the optical dome 220 to the antistatic portion 280 may be shorter than a radius of the optical dome 220. In the case in which the diameter of the base side of the optical dome 220 is 2.5 mm (in the case in which the radius of the optical dome 220 is 1250 μm), a distance from the outline of the optical dome 220 to the antistatic portion 280 may be about 1250 μmm or less. For example, a shortest distance from the outline of the optical dome 220 to the antistatic portion 280 may be preferably 500 μm or less.

Equivalent circuits of the light source 111 including the light emitting diode 210 and the antistatic member 260 are shown in FIGS. 11A and 11B.

The light emitting diode 210 may be electrically connected to the feed line 230 through the feed portion 240, and the first and second antistatic portions 281 and 282 may be positioned around the light emitting diode 210.

As shown in (a) of FIG. 11, the first and second antistatic portions 281 and 282 may be connected to the ground by the antistatic line 270. Charges captured by the first and second antistatic portions 281 and 282 may flow to the ground along the antistatic line 270.

Also, as shown in (b) of FIG. 11, the antistatic line 270 connected to the first and second antistatic portions 281 and 282 may be coupled with the ground by parasitic capacitance, without being directly connected to the ground. Charges captured by the first and second antistatic portions 281 and 282 may flow to the ground by the parasitic capacitance along the antistatic line 270.

By the antistatic member 260, electrostatic discharge tolerance of the light source 111 may be improved.

For example, as shown in FIG. 12, in the case in which an object CO charged with negative charges approaches or contacts the light source 111, the negative charges may be emitted from the charged object CO.

The emitted negative charges may not pass through the inside of the optical dome 220 made of a non-conductive material, and may move along the outer surface of the optical dome 220.

The negative charges moving along the outer surface of the optical dome 220 may move to the antistatic portion 280 along the outer surface of the substrate 112 at the boundary of the optical dome 220 and the substrate 112, or move to the feed portion 240 along the boundary of the optical dome 220 and the substrate 112.

In the case in which the antistatic portion 280 is located close to the outer surface of the optical dome 220, a large portion of the negative charges may move to the antistatic portion 280, and an extremely small portion of the negative charges may move to the feed portion 240. In other words, current generated by electrostatic discharge may flow to the ground through the antistatic portion 280, and extremely small current may flow to the light emitting diode 210 through the feed portion 240.

Therefore, the electrostatic discharge tolerance of the light source 111 may be improved. In other words, a voltage caused by electrostatic discharge, which the light source 111 is capable of tolerating, may increase.

According to an experiment, electrostatic discharge tolerance of a light source having an optical dome of which the diameter of the base side is 2.5 mm and of which the height is 0.7 mm was measured as about 3 kV. Meanwhile, in the case in which an antistatic portion of 0.5 mm*0.5 mm (width*height) is positioned within 0.5 mm from an optical dome having the same size, electrostatic discharge tolerance of the corresponding light source was improved to about 10 kV.

An arrangement and shape of the antistatic portion 280 for improving the electrostatic discharge tolerance of the light source 111 may vary.

Hereinafter, various arrangements and shapes of the antistatic portion 280 will be described.

Figure 13:
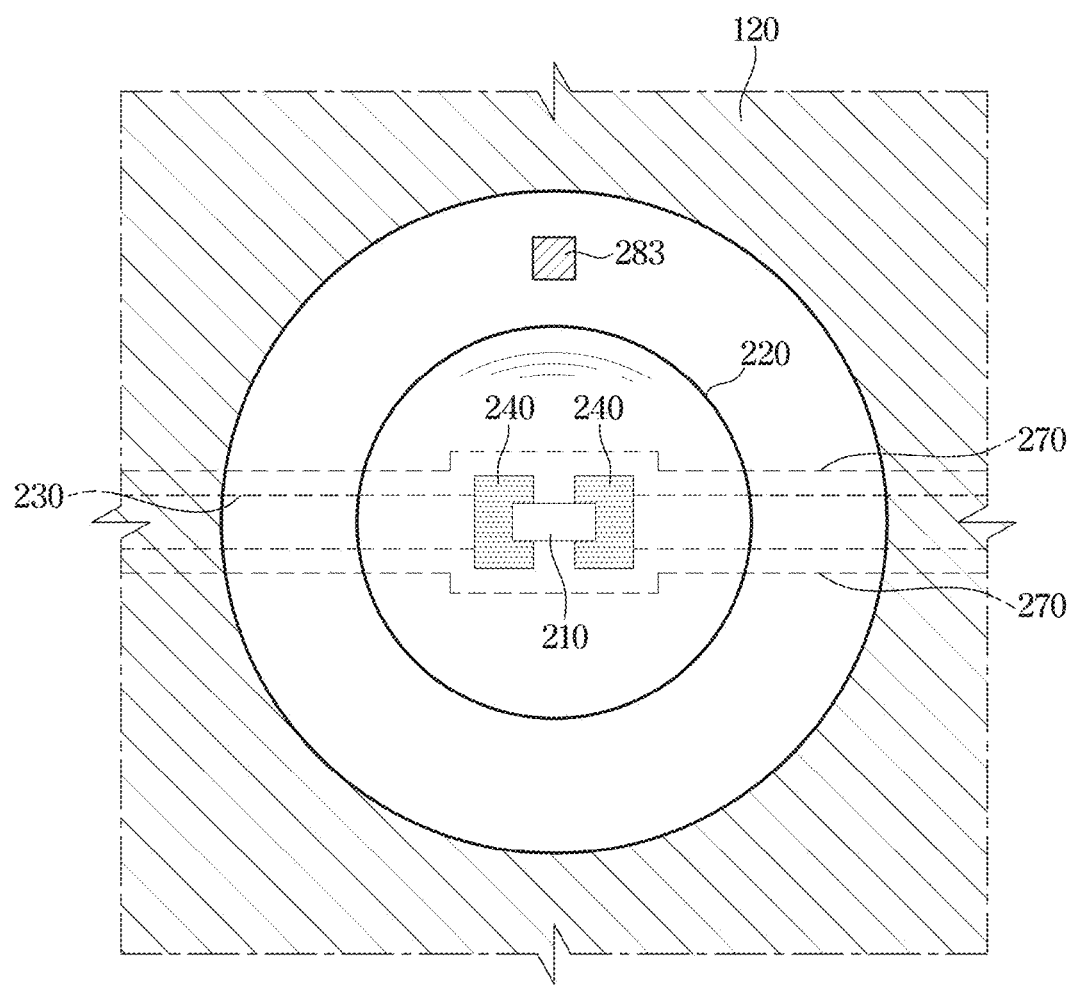
FIG. 13 shows a light source including an antistatic portion, according to an embodiment of the disclosure.
Figure 14:
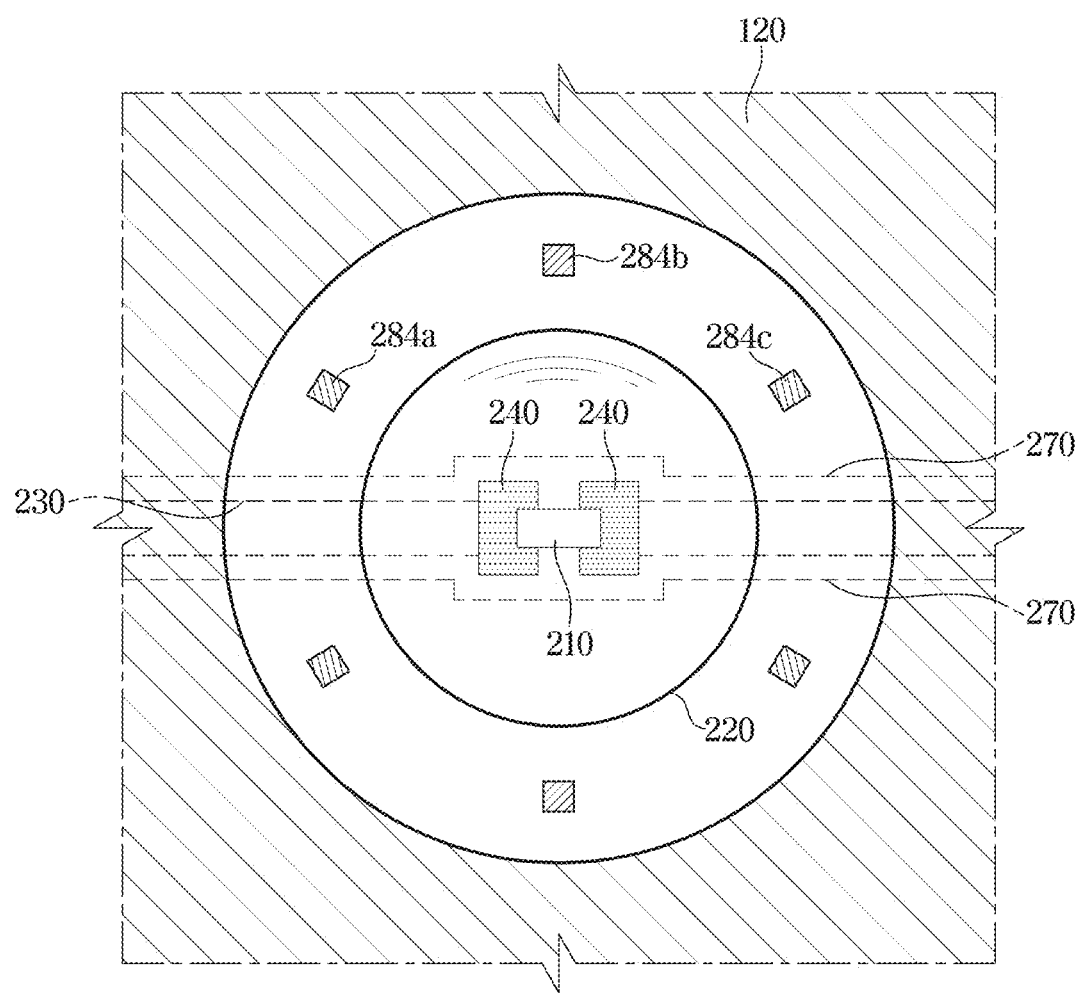
FIG. 14 shows a light source including three or more antistatic portions, according to an embodiment of the disclosure.

FIG. 13 shows a light source including an antistatic portion, according to an embodiment of the disclosure. FIG. 14 shows a light source including three or more antistatic portions, according to an embodiment of the disclosure.

FIGS. 6 and 10 show the first and second antistatic portions 281 and 282 positioned around the light source 111, however, the number of the antistatic portion 280 is not limited to that shown in FIGS. 6 and 10.

For example, as shown in FIG. 13, the antistatic member 260 may include a third antistatic portion 283 positioned around the light source 111. A structure (side cross-section) and shape of the third antistatic portion 283 may be the same as those of the first and second antistatic portions 281 and 282 shown in FIGS. 6 and 10.

The third antistatic portion 283 may be positioned in a direction in which electrostatic discharge mainly occurs.

For example, in the case in which electrostatic discharge frequently occurs at a specific location of the light source device 100, the third antistatic portion 283 may be positioned toward the specific location. In other words, the third antistatic portion 283 may be positioned closer to the specific location than the light emitting diode 210 of the light source 111 and/or the feed portion 240.

Also, in the case in which electrostatic discharge more frequently occurs at an outer portion of the light source device 100 than at a center portion of the light source device 100, the antistatic portion 280 may be positioned closer to the outer portion of the light source device 100 than the light emitting diode 210 of the light source 111 and/or the feed portion 240.

Therefore, because of the positioning of the third antistatic portion 283, the antistatic member 260 may protect the light emitting diode 210 from electrostatic discharge frequently occurring at a specific location.

In addition, by reducing the number of the antistatic portion 280, optical interference that is generated by the intrinsic color of the antistatic portion 280 may be reduced.

Accordingly, a distortion in color of light emitted from the light source device 100 may be reduced.

Also, as shown in FIG. 14, the antistatic member 260 may include three or more fourth antistatic portions 284a, 284b, and 284c provided around the light source 111. A structure and shape of each of the three or more fourth antistatic portions 284a, 284b, and 284c may be the same as those of the first and second antistatic portions 281 and 282 described above.

The three or more fourth antistatic portions 284a, 284b, and 284c may surround the optical dome 220.

The three or more fourth antistatic portions 284a, 284b, and 284c may be maximally spaced from each other on a circumference of a virtual circle surrounding the optical dome 220. For example, the three or more fourth antistatic portions 284a, 284b, and 284c may be positioned at substantially equidistant intervals along the circumference of the virtual circle surrounding the optical dome 220. The three fourth antistatic portions 284a, 284b, and 284c may be positioned to form an angle of about 120 degrees with respect to each other along the circumference of the virtual circle surrounding the optical dome 220. Also, as shown in FIG. 14, six antistatic portions may be positioned to form an angle of about 60 degrees with respect to each other along the circumference of the virtual circle surrounding the optical dome 220. In this case, the light emitting diode 210 and/or the feed portion 240 may be positioned at a center of the virtual circle surrounding the optical dome 220.

Because the three or more fourth antistatic portions 284a, 284b, and 284c are positioned around the optical dome 220, the antistatic member 260 may protect the light emitting diode 210 from electrostatic discharge generated in substantially all directions with respect to the optical dome 220. In other words, because the three or more fourth antistatic portions 284a, 284b, and 284c are positioned around the optical dome 220, distances from a location at which electrostatic discharge occurs on the outer surface of the optical dome 220 to the three or more fourth antistatic portions 284a, 284b, and 284c may be reduced. Therefore, a portion of electrostatic discharged charges captured by the three or more fourth antistatic portions 284a, 284b, and 284c may further increase, and the electrostatic discharge tolerance of the light source 111 may be further improved.

Optical interference caused by the three or more fourth antistatic portions 284a, 284b, and 284c may be removed by reducing sizes of the three or more fourth antistatic portions 284a, 284b, and 284c. In other words, the sizes of the three or more fourth antistatic portions 284a, 284b, and 284c may be reduced such that a total area of the three or more fourth antistatic portions 284a, 284b, and 284c becomes a preset area.

Figure 15:
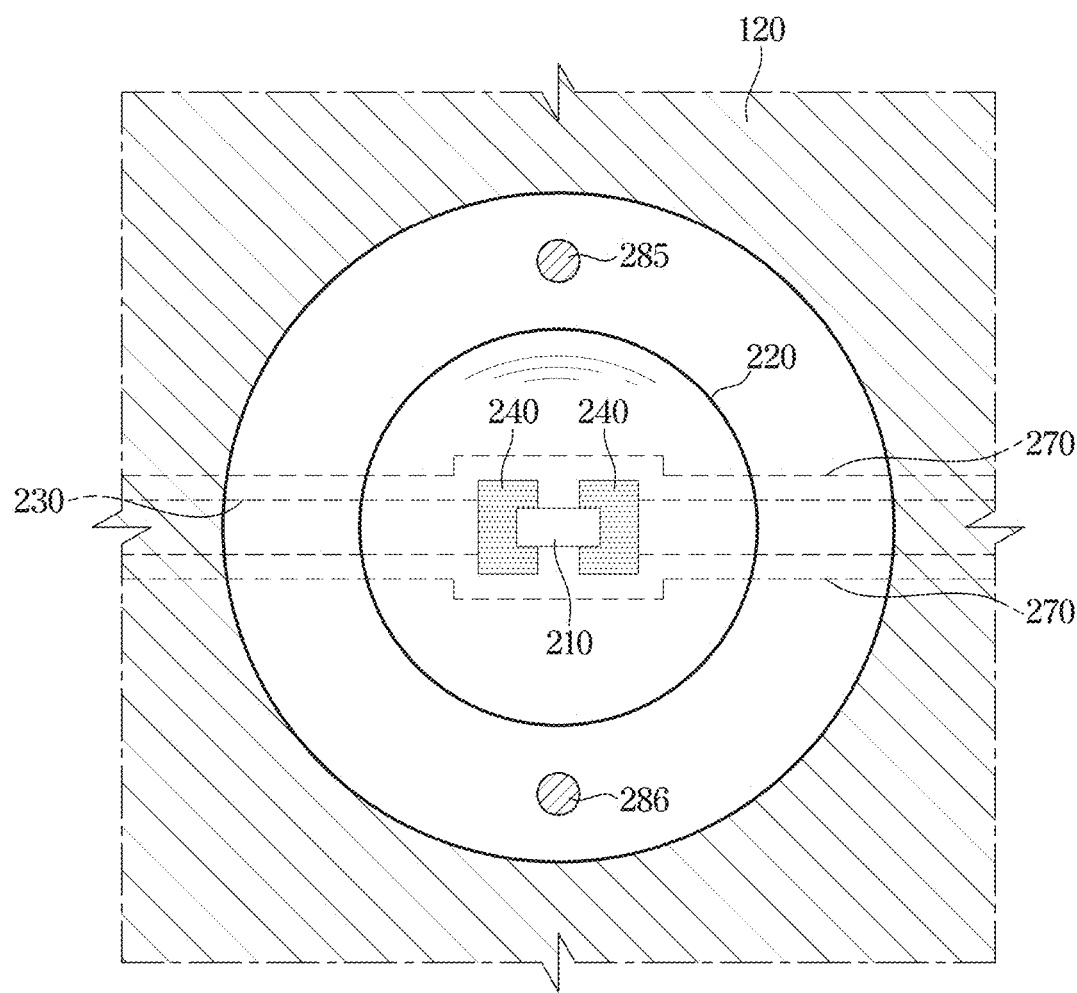
FIG. 15 shows a light source including an antistatic portion being in a shape of a circle, according to an embodiment of the disclosure.
Figure 16:
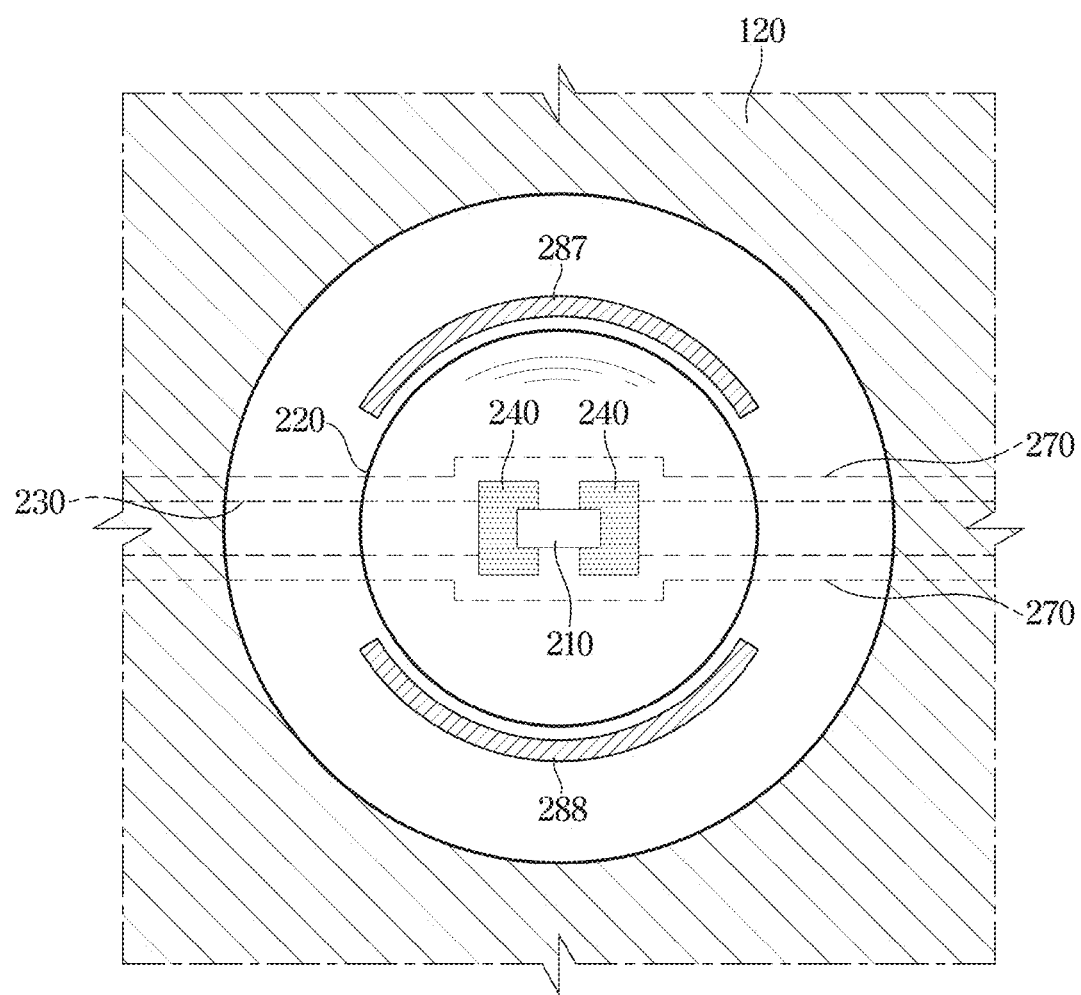
FIG. 16 shows a light source including an antistatic portion being in a shape of an arc, according to an embodiment of the disclosure.

FIG. 15 shows a light source including an antistatic portion being in a shape of a circle, according to an embodiment of the disclosure. FIG. 16 shows a light source including an antistatic portion being in a shape of an arc, according to an embodiment of the disclosure.

FIGS. 6 and 10 show the first and second antistatic portions 281 and 282 each being in a shape of substantially a rectangle, however, the shape of the antistatic portion 280 is not limited to that shown in FIGS. 6 and 10.

For example, as shown in FIG. 15, the antistatic member 260 may include fifth and sixth antistatic portions 285 and 286 each being in a shape of substantially a circle. Structures (side cross-sections) of the fifth and sixth antistatic portions 285 and 286 being in the shape of the circle may be the same as those of the first and second antistatic portions 281 and 282 shown in FIGS. 6 and 10.

Because a circular antistatic portion has no directivity, the fifth and sixth antistatic portions 285 and 286 may easily capture charges generated by electrostatic discharge occurred around the fifth and sixth antistatic portions 285 and 286.

The shape of the antistatic portion 280 is not limited to a rectangle and a circle. For example, the shape of the antistatic portion 280 may be a polygon including a triangle, a rectangle, a pentagon, a hexagon, etc. Also, the shape of the antistatic portion 280 may be a circle, an oval, a semicircle, a segment of a circle, etc.

Also, as shown in FIG. 16, the antistatic member 260 may include seventh and eighth antistatic portions 287 and 288 each being in a shape of substantially an arc, which surround the optical dome 220.

A structure (side cross-section) of the antistatic portion 280 being in the shape of the arc may be the same as those of the first and second antistatic portions 281 and 282 shown in FIGS. 6 and 10.

Unlike the three or more fourth antistatic portions 284a, 284b, and 284c arranged at substantially equidistant intervals on the circumference of the virtual circle surrounding the optical dome 220, each of the seventh and eighth antistatic portions 287 and 288 shown in FIG. 16 may be in a shape of an arc of an virtual circle surrounding the optical dome 220.

Because the seventh and eighth antistatic portions 287 and 288 being in the shape of the arc surrounding the optical dome 220 are provided, the light emitting diode 210 may be protected from electrostatic discharge occurring in all directions with respect to the optical dome 220. In other words, because the seventh and eighth antistatic portions 287 and 288 being in the shape of the arc are positioned around the optical dome 220, distances from a location at which electrostatic discharge occurs on the outer surface of the optical dome 220 to the seventh and eighth antistatic portions 287 and 288 may be greatly reduced. Therefore, a portion of electrostatic discharged charges captured by the seventh and eighth antistatic portions 287 and 288 may further increase, and the electrostatic discharge tolerance of the light source 111 may be further improved.

However, the shape of the antistatic portion 280 is not limited to an arc shape, and the antistatic portion 280 may be in a shape of a ring. In other words, the antistatic portion 280 may be in a shape of a ring surrounding the optical dome 220.

Figure 17:
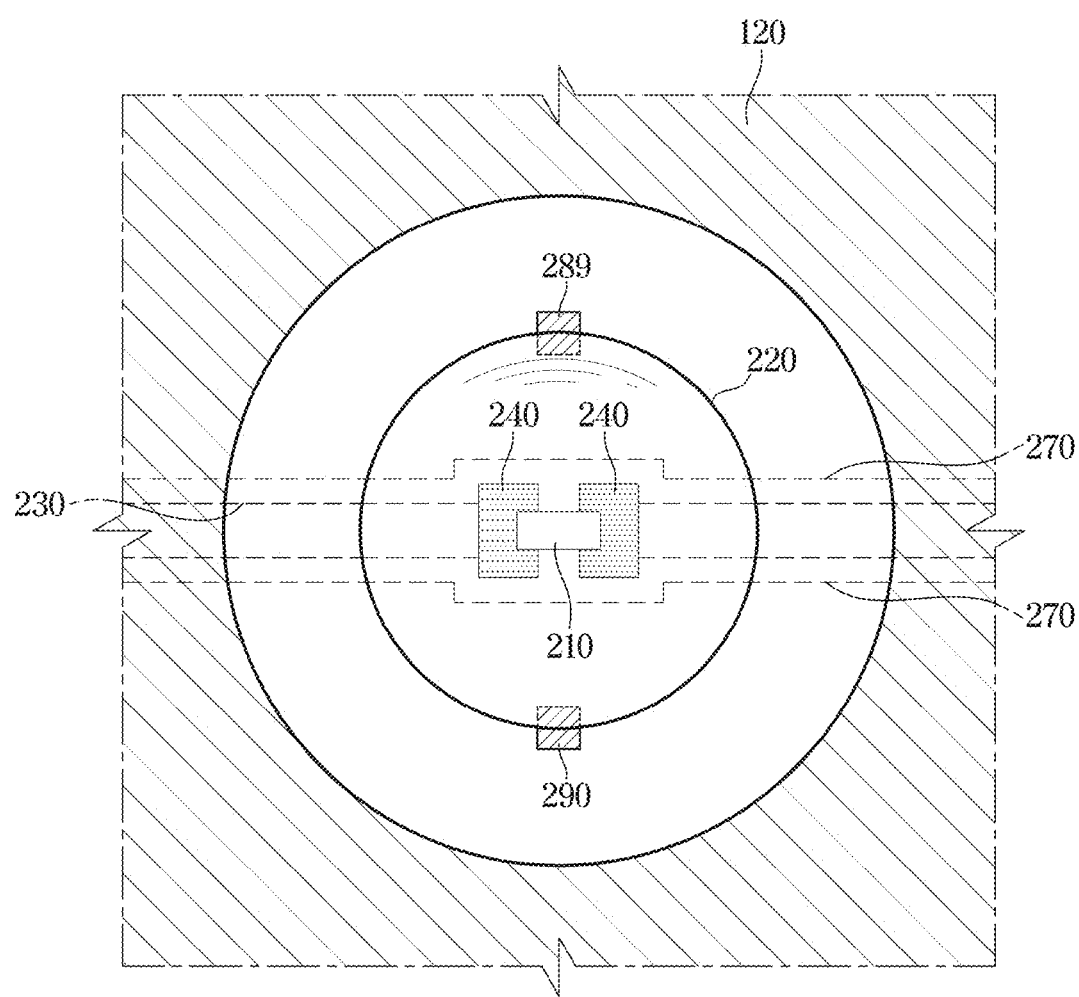
FIG. 17 shows a light source including an antistatic portion of which a portion overlaps with an optical dome, according to an embodiment of the disclosure.
Figure 18:
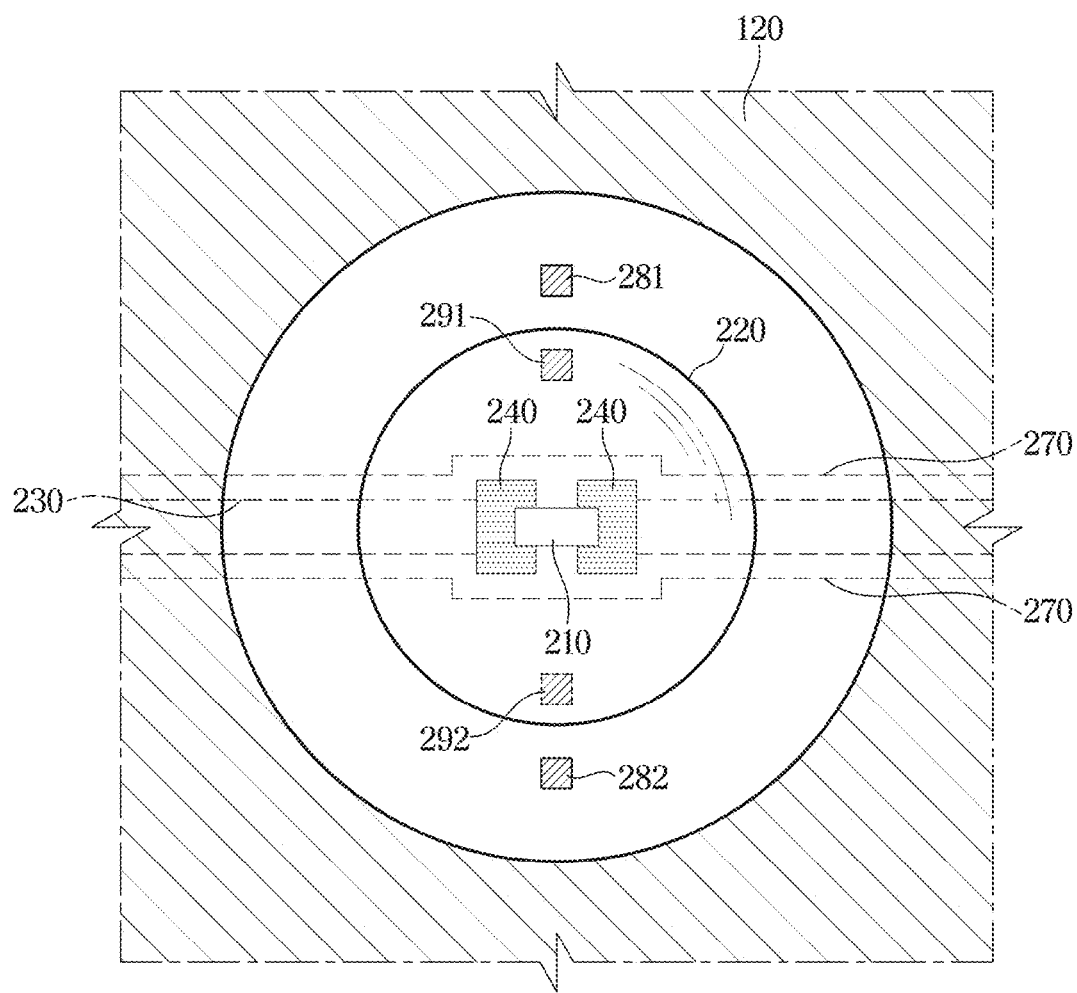
FIG. 18 shows a light source including an antistatic portion overlapping with an optical dome and an antistatic portion not overlapping with the optical dome, according to an embodiment of the disclosure.
Figure 19:
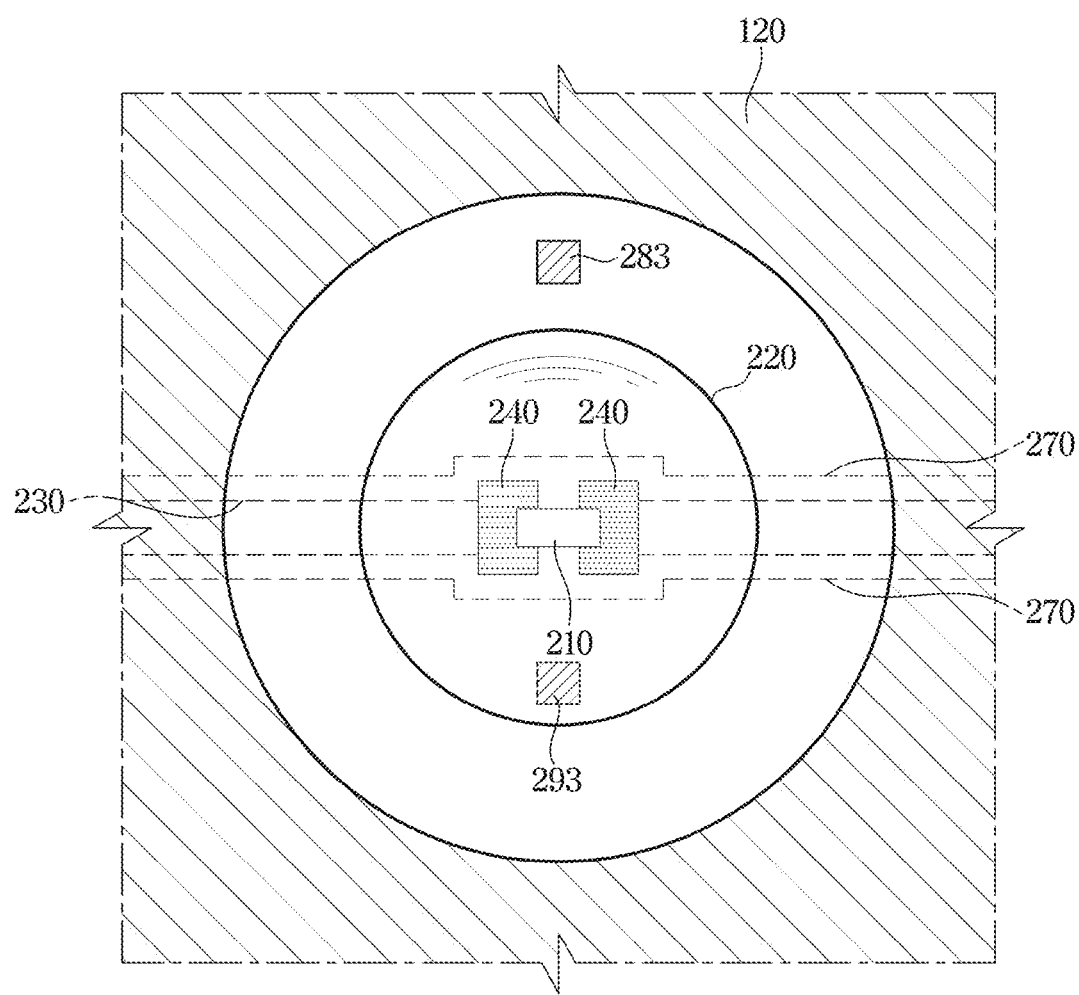
FIG. 19 shows a light source including an antistatic portion overlapping with an optical dome and an antistatic portion not overlapping with the optical dome, according to an embodiment of the disclosure.
Figure 20:
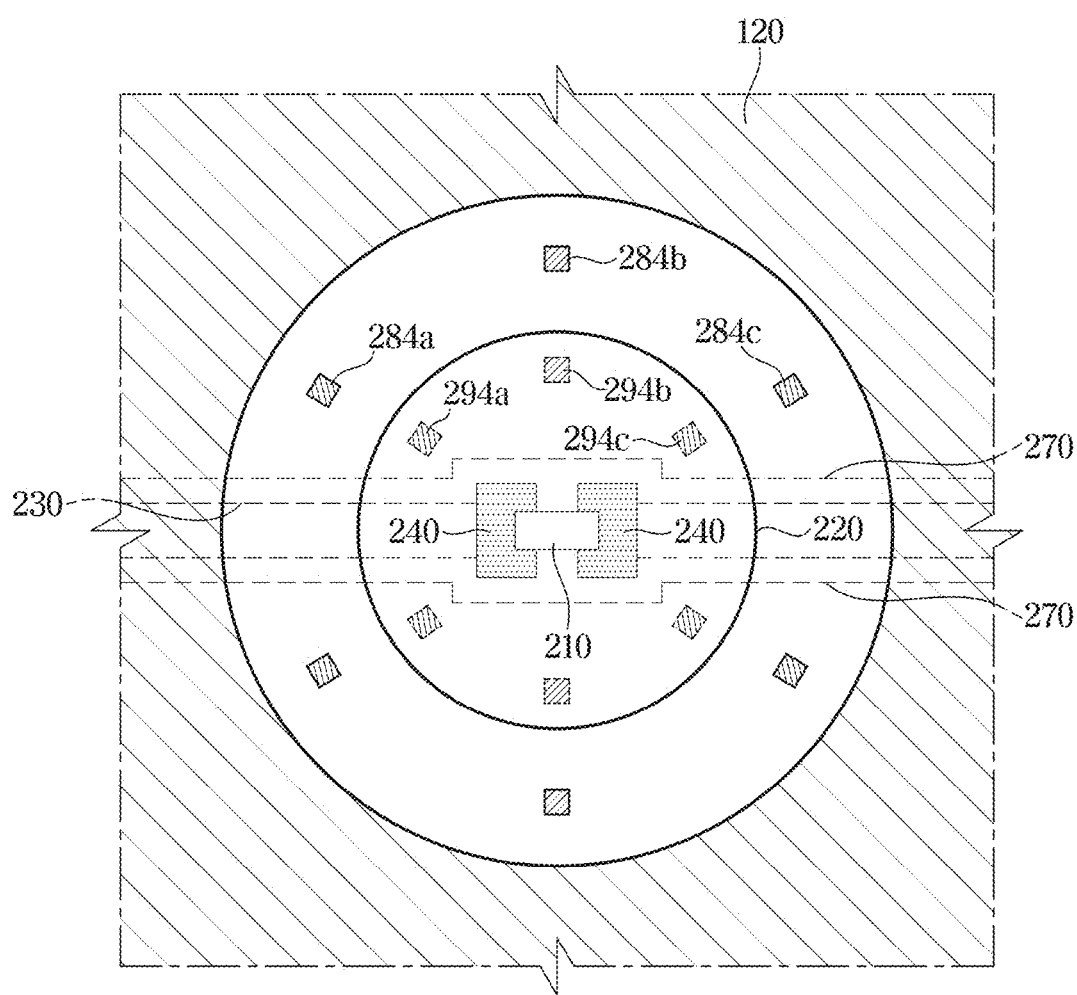
FIG. 20 shows a light source including three or more antistatic portions overlapping with an optical dome and three or more antistatic portions not overlapping with the optical dome, according to an embodiment of the disclosure.
Figure 21:
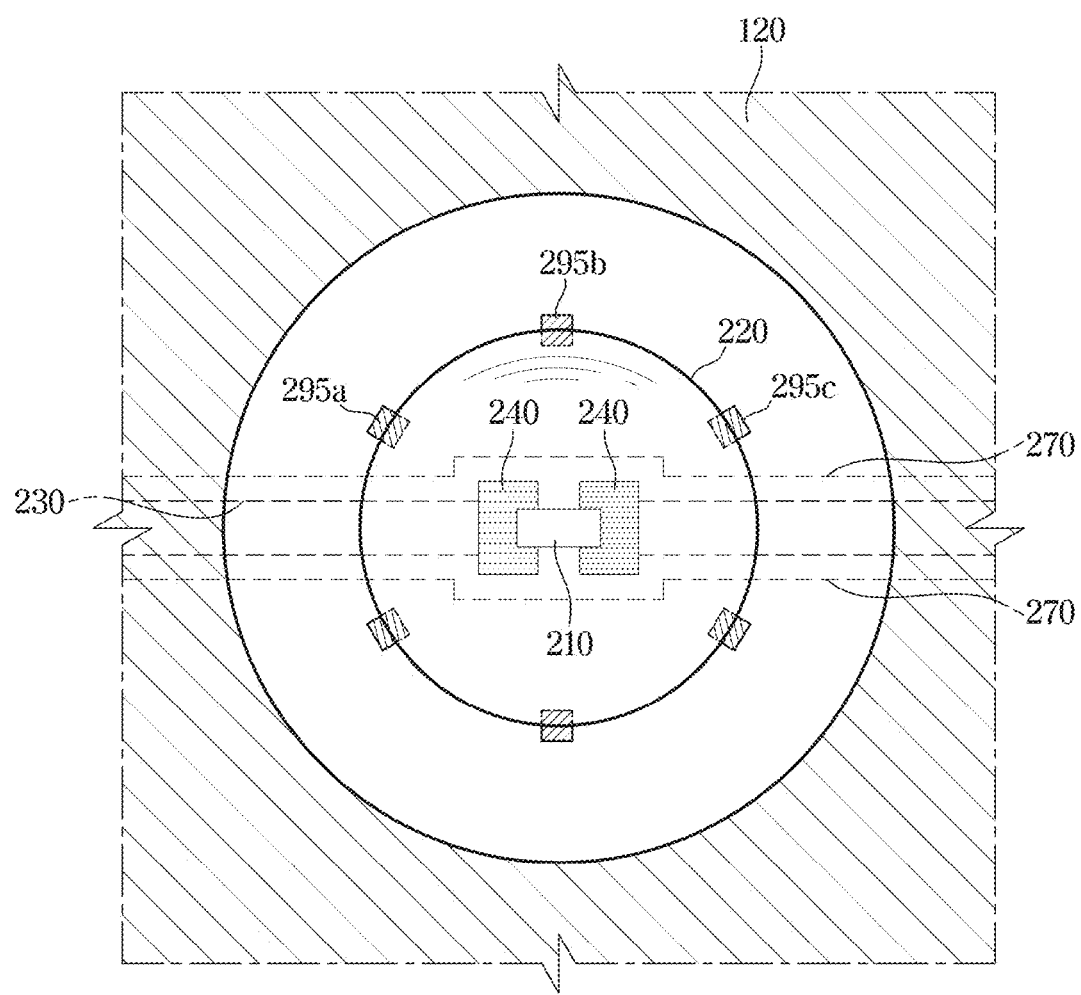
FIG. 21 shows a light source including three or more antistatic portions of which portions overlap with an optical dome, according to an embodiment of the disclosure.

FIG. 17 shows a light source including an antistatic portion of which a portion overlaps with an optical dome, according to an embodiment of the disclosure. FIG. 18 shows a light source including an antistatic portion overlapping with an optical dome and an antistatic portion not overlapping with the optical dome, according to an embodiment of the disclosure. FIG. 19 shows a light source including an antistatic portion overlapping with an optical dome and an antistatic portion not overlapping with the optical dome, according to an embodiment of the disclosure. FIG. 20 shows a light source including three or more antistatic portions overlapping with an optical dome and three or more antistatic portions not overlapping with the optical dome, according to an embodiment of the disclosure. FIG. 21 shows a light source including three or more antistatic portions of which portions overlap with an optical dome, according to an embodiment of the disclosure.

FIGS. 6 and 10 shows the first and second antistatic portions 281 and 282 not overlapping with the optical dome 220, and a relative arrangement of the optical dome 220 and the antistatic portion 280 is not limited to the arrangement shown in FIGS. 6 and 10.

For example, as shown in FIG. 17, the antistatic member 260 may include ninth and tenth antistatic portion 289 and 290 of which portions overlap with the optical dome 220. Structures (side cross-sections) of the ninth and tenth antistatic portions 289 and 290 may be the same as those of the first and second antistatic portions 281 and 282 shown in FIGS. 6 and 10.

The ninth and tenth antistatic portions 289 and 290 of which portions overlap with the optical dome 220 may be positioned at an area at which the outer surface of the optical dome 220 crosses the substrate 112. As described above, charges generated by electrostatic discharge may move to the boundary between the optical dome 220 and the substrate 112 along the outer surface of the optical dome 220. Because the ninth and tenth antistatic portions 289 and 290 are positioned at the boundary between the outer surface of the optical dome 220 and the substrate 112, charges moving along the outer surface of the optical dome 220 may move to the ninth and tenth antistatic portions 289 and 290. Accordingly, a probability that charges moving along the outer surface of the optical dome 220 will be captured by the antistatic member 260 may further increase. Also, the antistatic performance of the antistatic member 260 may be improved, and the electrostatic discharge tolerance of the light source 111 may be improved.

Also, as shown in FIG. 18, the antistatic member 260 may include the first and second antistatic portions 281 and 282 positioned outside the outer surface of the optical dome 220, and eleventh and twelfth antistatic portions 291 and 292 positioned to the inner side from the outer surface of the optical dome 220. Structures (side cross-sections) and shapes of the ninth and twelfth antistatic portions 291 and 292 may be the same as those of the first and second antistatic portions 281 and 282 shown in FIGS. 6 and 10.

As described above, the first and second antistatic portions 281 and 282 may capture charges moving outward from the outer surface of the optical dome 220. Also, the eleventh and twelfth antistatic portions 291 and 292 may capture charges moving inward from the outer surface of the optical dome 220 along the boundary between the optical dome 220 and the substrate 112.

Accordingly, the antistatic member 260 including the antistatic portions 281, 282, 291, and 292 positioned to the outer and inner sides from the outer surface of the optical dome 220 may capture a major portion of charges generated by electrostatic discharge. Accordingly, the antistatic performance of the antistatic member 260 may be improved, and the electrostatic discharge tolerance of the light source 111 may be improved.

As shown in FIG. 19, the antistatic member 260 may include the third antistatic portion 283 positioned to the outer side from the outer surface of the optical dome 220, and a thirteenth antistatic portion 293 positioned to the inner side from the outer surface of the optical dome 220. A structure (side cross-section) and shape of the thirteenth antistatic portion 293 may be the same as those of the first and second antistatic portions 281 and 282 shown in FIGS. 6 and 10.

By minimizing the number of the antistatic portions, optical interference due to the intrinsic color of the antistatic portion 280 may be reduced. Accordingly, a distortion in color of light emitted from the light source device 100 may be reduced.

As shown in FIG. 20, the antistatic member 260 may include the three or more fourth antistatic portions 284a, 284b, and 284c positioned outside the light source 111, and three or more fourteenth antistatic portions 294a, 294b, and 294c positioned inside the light source 111. Structures and shapes of the three or more fourth antistatic portions 284a, 284b, and 284c and the three or more fourteenth antistatic portions 294a, 294b, and 294c may be the same as those of the first and second antistatic portions 281 and 282 described above.

The three or more fourth antistatic portions 284a, 284b, and 284c may surround the optical dome 220. The three or more fourteenth antistatic portions 294a, 294b, and 294c may surround the light emitting diode 210 and the feed portion 240. An arrangement of the three or more fourth antistatic portions 284a, 284b, and 284c may be the same as that of the three or more fourth antistatic portions 284a, 284b, and 284c shown in FIG. 14.

The three or more fourteenth antistatic portions 294a, 294b, and 294c may be arranged on a circumference of an virtual circle surrounding the light emitting diode 210 and the feed portion 240, and maximally spaced from each other on the circumference of the virtual circle. For example, the three or more fourteenth antistatic portions 294a, 294b, and 294c may be arranged at substantially equidistant intervals along the circumference of the virtual circle surrounding the light emitting diode 210 and the feed portion 240. Six antistatic portions as shown in FIG. 20 may be arranged to form an angle of about 60 degrees with respect to each other along the circumference of the virtual circle surrounding the light emitting diode 210 and the feed portion 240.

Because the three or more fourteenth antistatic portions 294a, 294b, and 294c are provided inside the optical dome 220, the antistatic member 260 may capture charges generated by electrostatic discharge in substantially all directions, the charges being permeated into the inside of the optical dome 220. Therefore, a portion of electrostatic discharged charges captured by the antistatic member 260 may further increase, and the electrostatic discharge tolerance of the light source 111 may be further improved.

As shown in FIG. 21, the antistatic member 260 may include three or more fifteenth antistatic portions 295a, 295b, and 295c of which portions overlap with the optical dome 220. Structures and shapes of the three or more fifteenth antistatic portions 295a, 295b, and 295c may be the same as those of the first and second antistatic portions 281 and 282 described above.

The three or more fifteenth antistatic portions 295a, 295b, and 295c may be arranged on a circumference of an virtual circle corresponding to an outermost portion of the optical dome 220, and maximally spaced from each other on the circumference of the virtual circle. For example, the three or more fifteenth antistatic portions 295a, 295b, and 295c may be arranged at substantially equidistant intervals along the outermost portion of the optical dome 220.

Because the three or more fifteenth antistatic portions 295a, 295b, and 295c of which portions overlap with the optical dome 220 are provided, the antistatic member 260 may capture charges generated by electrostatic discharge in substantially all directions, the charges being permeated into the inside of the optical dome 220. Therefore, a portion of electrostatic discharged charges captured by the antistatic member 260 may further increase, and the electrostatic discharge tolerance of the light source 111 may be further improved.

As described above, the antistatic portion 280 for protecting the light emitting diode 210 from electrostatic discharge may be in various numbers, shapes, and arrangements as necessary.

Also, the structure (side cross-section) of the antistatic portion 280 is also not limited to that shown in FIG. 9, and the antistatic portion 280 may be formed with various structures.

Figure 22:
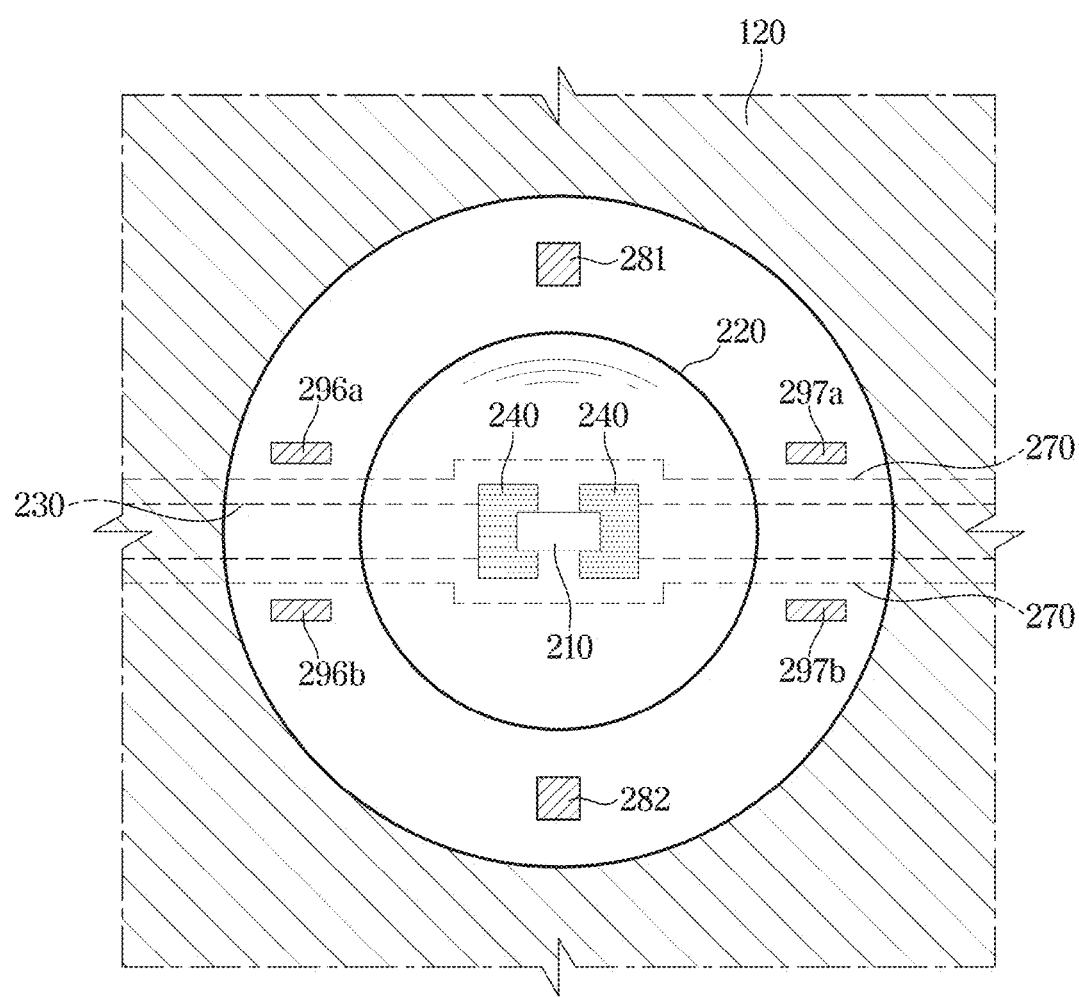
FIG. 22 shows a light source including an antistatic portion for protecting a feed line, according to an embodiment of the disclosure.

FIG. 22 shows a light source including an antistatic portion for protecting a feed line, according to an embodiment of the disclosure.

As shown in FIG. 22, the antistatic member 260 may include the first and second antistatic portions 281 and 282 arranged around the optical dome 220, and sixteenth antistatic portions 296a and 296b and seventeenth antistatic portions 297a and 297b arranged around the feed line 230. Structures (side cross-sections) and shapes of the sixteenth and seventeenth antistatic portions 296a, 296b, 297c, and 297b may be the same as those of the first and second antistatic portions 281 and 282 shown in FIGS. 6 and 10.

The first and second antistatic portions 281 and 282 may capture charges moving outward from the outer surface of the optical dome 220.

The protection layer 253 may be configured generally with an insulator, and protect a feed circuit such as the feed line 230 from electrostatic discharge. However, because the protection layer 253 has a thin thickness compared to the optical dome 220, the protection layer 253 may have a lower voltage level capable of protecting the feed circuit such as the feed line 230 from electrostatic discharge than the optical dome 220. Accordingly, charges may permeate into the feed line 230 by electrostatic discharge generated around the feed line 230, and the charges may damage the light emitting diode 210 via the feed line 230.

To prevent or suppress permeation of charges through the feed line 230, the sixteenth and seventeenth antistatic portions 296a, 296b, 297a, and 297b may be provided around the feed line 230. As shown in FIG. 22, the sixteenth antistatic portions 296a and 296b may be arranged to both sides of the feed line 230 along the feed line 230. The seventeenth antistatic portions 297a and 297b may be also arranged to both sides of the feed line 230 along the feed line 230.

Due to the sixteenth and seventeenth antistatic portions 296a, 296b, 297a, and 297b, the light emitting diode 210 may be prevented or suppressed from being damaged by electrostatic discharge generated around the feed line 230.

Figure 23:
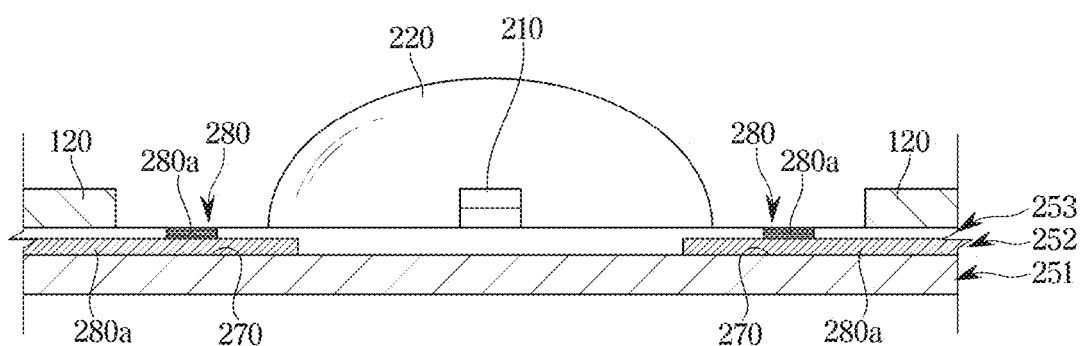
FIG. 23 shows another example of a side cross-section of the light source shown in FIG. 6, taken in the B-B' direction of FIG. 6.

FIG. 23 shows another example of a side cross-section of the light source shown in FIG. 6, taken in the B-B' direction of FIG. 6.

As shown in FIG. 23, the protection layer 253 may cover the antistatic line 270 to prevent the antistatic line 270 from being exposed to the outside. Herein, a window for forming the antistatic portion 280 for capturing current generated by electrostatic discharge may be formed in the protection layer 253. As such, the antistatic line 270 may be exposed to the outside through the antistatic portion 280.

A conductive adhesive material 280a may be applied on the antistatic portion 280. The conductive adhesive material 280a may be applied in the window of the protection layer 253.

The conductive adhesive material 280a may include a solder having electrical conductivity. The solder is known to have high light reflectivity.

Because the conductive adhesive material 280a having high light reflectivity is applied on the antistatic portion 280, optical interference that is caused by the antistatic line 270 exposed through the antistatic portion 280 may be reduced. In other words, a spectrum of light emitted from the light source 111 may be prevented or suppressed from being distorted by a color of the antistatic portion 280 formed with copper.

Accordingly, an area of the antistatic portion 280 may be enlarged without causing the mura (unevenness) phenomenon.

Figure 24:
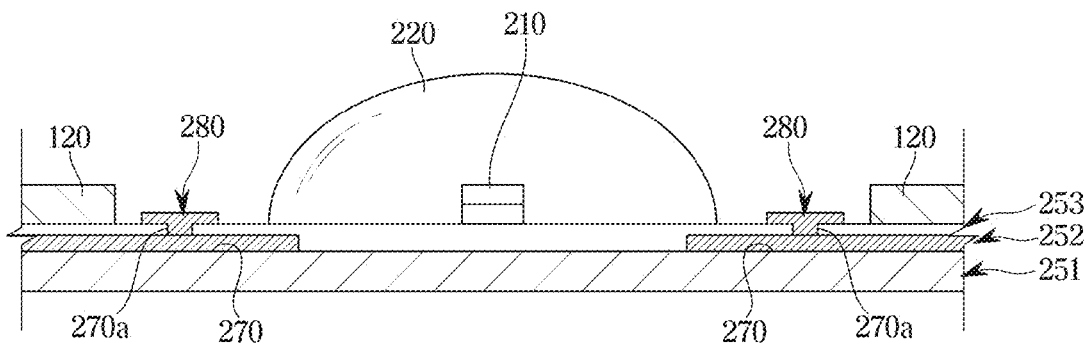
FIG. 24 shows another example of a side cross-section of the light source shown in FIG. 6, taken in the B-B' direction of FIG. 6.

FIG. 24 shows another example of a side cross-section of the light source shown in FIG. 6, taken in the B-B' direction of FIG. 6.

As shown in FIG. 24, the protection layer 253 may cover the antistatic line 270 to prevent the antistatic line 270 from being exposed to the outside. Herein, in the protection layer 253, a via-hole 270a may be formed to form the antistatic portion 280 for capturing current generated by electrostatic discharge. The antistatic portion 280 may be formed on the protection layer 253, and the antistatic portion 280 may be electrically connected to the antistatic line 270 through the via-hole 280a of the protection layer 253.

As such, because the antistatic portion 280 is formed on the protection layer 253, performance of the antistatic member 260 of capturing charges generated by electrostatic discharge may be improved. Accordingly, the electrostatic discharge tolerance of the light source 111 may be further improved.

According to an embodiment of the disclosure, a light source device may include: a reflective sheet in which a hole is formed; and a light source module exposed through the hole. The light source module may include a substrate disposed in parallel with the reflective sheet, where a first surface of the substrate is toward the reflective sheet, a light emitting diode provided in an area defined by the hole on the first surface of the substrate, a feed portion provided on the first surface of the substrate and contacting the light emitting diode, an insulating dome provided in the area defined by the hole on the first surface of the substrate and covering the light emitting diode, and at least one antistatic portion provided in the area defined by the hole on the first surface of the substrate, without contacting the light emitting diode.

The at least one antistatic portion may capture charges generated by electrostatic discharge. Accordingly, the light emitting diode may be prevented or suppressed from being damaged by electrostatic discharge.

The at least one antistatic portion may be provided outside an area defined by an outline of the insulating dome. Accordingly, light may be prevented or suppressed from being distorted by optical interference caused by an intrinsic color of the antistatic portion, and mura or dark portions of the display apparatus may be prevented or suppressed.

The at least one antistatic portion may include a plurality of antistatic portions arranged on a circumference of a virtual circle surrounding the light emitting diode and the feed portion, and the plurality of antistatic portions may be arranged at substantially equidistant intervals on the circumference of the virtual circle. Accordingly, the plurality of antistatic portions may capture charges generated in all directions by electrostatic discharge, and the electrostatic tolerance of the light source module may be improved.

The at least one antistatic portion may be in a shape of an arc of a virtual circle surrounding the light emitting diode and the feed portion. Accordingly, the plurality of antistatic portions may capture charges generated in all directions by electrostatic discharge, and the electrostatic tolerance of the light source module may be improved.

A portion of the at least one antistatic portion may overlap with the insulating dome. Accordingly, the at least one antistatic portion may capture charges moving along a boundary between the insulating dome and the substrate.

The at least one antistatic portion may include an external antistatic portion positioned outside an area defined by an outline of the insulating dome, and an internal antistatic portion positioned inside the area defined by the outline of the insulating dome. Accordingly, the at least one antistatic portion may capture charges moving along the boundary between the insulating dome and the substrate, as well as charges floating outside the insulating dome.

A size of the at least one antistatic portion may be 0.16% or more of a size of the area defined by the outline of the insulating dome. The at least one antistatic portion may capture a large amount of charges generated by electrostatic discharge, and the electrostatic tolerance of the light source module may be improved.

A shortest distance of the at least one antistatic portion to the outline of the insulating dome may be shorter than or equal to a radius of the area defined by the outline of the insulating dome. The at least one antistatic portion may capture a larger amount of charges generated by electrostatic discharge, and the electrostatic tolerance of the light source module may be improved.

The substrate may include an antistatic line having conductivity and a protection layer covering a surface of the antistatic line, and the antistatic portion may include the antistatic line exposed to outside by a window formed in the protection layer. The antistatic line may be electrically connected to a ground of the light source device or coupled with the ground by capacitance. Accordingly, the at least one antistatic portion may capture a larger amount of charges generated by electrostatic discharge, and the electrostatic tolerance of the light source module may be improved.

The antistatic portion may further include a solder applied on the antistatic line exposed to the outside by the window formed in the protection layer. Accordingly, light may be prevented or suppressed from being distorted by optical interference caused by the intrinsic color of the antistatic portion, and mura or dark portions of the display apparatus may be prevented or suppressed.

The light emitting diode may directly contact the feed portion without a wire or a ball grid, and the light emitting diode may directly contact the feed portion without a Zener diode connected in parallel with the light emitting diode. Accordingly, the light source emitting light may be miniaturized, uniformity of surface light emitted from the light source device may be improved, and a contrast rate of the display apparatus may also be improved by dimming.

Meanwhile, the disclosed embodiments may be implemented in the form of a recording medium storing instructions that can be executed by a computer. The instructions may be stored in the form of program codes, and when executed by a processor, the instructions may create a program to perform operations of the disclosed embodiments. The recording medium may be implemented as a computer-readable recording medium.

The computer-readable recording medium may include all kinds of recording media that can be interpreted by a computer. For example, the computer-readable recording medium may be Read Only Memory (ROM), Random Access Memory (RAM), a magnetic tape, a magnetic disc, a flash memory, an optical data storage, or the like.

The machine-readable storage medium may be provided in the form of a non-transitory storage medium, wherein the term 'non-transitory' simply means that the storage medium is a tangible device, and does not include a signal (e.g., an electromagnetic wave), but this term does not differentiate between where data is semi-permanently stored in the storage medium and where the data is temporarily stored in the storage medium. For example, a 'non-transitory storage medium' may include a buffer in which data is temporarily stored.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloadable or uploadable) online via an application store (e.g., Play Store™) or between two user devices (e.g., smart phones) directly. When distributed online, at least part of the computer program product (e.g., a downloadable app) may be temporarily generated or at least temporarily stored in the machine-readable storage medium, such as a memory of the manufacturer's server, a server of the application store, or a relay server.

So far, the disclosed embodiments have been described with reference to the accompanying drawings. It will be apparent that those skilled in the art can make various modifications thereto without changing the technical spirit and essential features of the present disclosure. Thus, it should be understood that the embodiments described above are merely for illustrative purposes and not for limitation purposes in all aspects.

What is claimed is:

1. A light apparatus comprising:
a substrate;
a light emitting diode disposed on the substrate;
a feed pad provided on the substrate;
at least one antistatic pad provided on the substrate; and
an optical dome provided on the substrate,
wherein the at least one antistatic pad is provided outside an area defined by an outline of the optical dome.

2. The light apparatus of claim 1, wherein the feed pad is provided inside the area defined by the outline of the optical dome.

3. The light apparatus of claim 1, further comprising a reflective sheet covering the substrate.

4. The light apparatus of claim 3, wherein the reflective sheet has a hole through which the optical dome is exposed.

5. The light apparatus of claim 1, wherein the feed pad is in contact with the light emitting diode.

6. The light apparatus of claim 1, wherein the at least one antistatic pad is not in contact with the light emitting diode.

7. The light apparatus of claim 1, wherein the at least one antistatic pad is grounded.

8. The light apparatus of claim 1, wherein the at least one antistatic pad comprises an antistatic line which is grounded, and the substrate comprises at least one window through which the antistatic line is exposed.

9. The light apparatus of claim 8, wherein the antistatic line is electrically directly connected to a ground or coupled with the ground by capacitance.

10. The light apparatus of claim 1, wherein a size of the at least one antistatic pad is 0.16% or more of the area defined by the outline of the optical dome.

11. The light apparatus of claim 1, wherein a shortest distance of the at least one antistatic pad to the outline of the optical dome is shorter than or equal to a radius of the area defined by the outline of the optical dome.

12. The light apparatus of claim 1, wherein the at least one antistatic pad comprises a plurality of antistatic pads arranged on a circumference of a virtual circle surrounding the light emitting diode and the feed pad.

13. The light apparatus of claim 12, wherein the plurality of antistatic pads comprises a first antistatic pad and a second antistatic pad, wherein the first antistatic pad and the second antistatic pad are positioned to form an angle of 180 degrees with respect to each other along the circumference of the virtual circle surrounding the light emitting diode and the feed pad.

14. The light apparatus of claim 1, wherein the light emitting diode directly contacts the feed pad without a wire or a ball grid.

15. The light apparatus of claim 1, wherein the light emitting diode directly contacts the feed pad without a Zener diode connected in parallel with the light emitting diode.

16. A display apparatus comprising:
a display panel; and
a light apparatus configured to output light to the display panel,
wherein the light apparatus comprises:
a substrate;
a light emitting diode disposed on the substrate;
a feed pad provided on the substrate;
at least one antistatic pad provided on the substrate; and
an optical dome provided on the substrate, and
wherein the at least one antistatic pad is provided outside an area defined by an outline of the optical dome.

17. The display apparatus of claim 16, wherein the feed pad is provided inside the area defined by the outline of the optical dome.

18. The display apparatus of claim 16, wherein the light apparatus further comprises a reflective sheet covering the substrate, wherein the reflective sheet has a hole through which the optical dome is exposed.

19. The display apparatus of claim 16, wherein the at least one antistatic pad comprises an antistatic line which is grounded, and the substrate comprises at least one window through which the antistatic line is exposed.

20. The display apparatus of claim 16, wherein the at least one antistatic pad comprises a plurality of antistatic pads arranged on a circumference of a virtual circle surrounding the light emitting diode and the feed pad, wherein the plurality of antistatic pads comprises a first antistatic pad and a second antistatic pad, wherein the first antistatic pad and the second antistatic pad are positioned to form an angle of 180 degrees with respect to each other along the circumference of the virtual circle surrounding the light emitting diode and the feed pad.

* * * * *